(12) United States Patent
Dunn et al.

(10) Patent No.: US 12,314,093 B2
(45) Date of Patent: *May 27, 2025

(54) DISPLAY ASSEMBLIES FOR PROVIDING COMPRESSIVE FORCES AT ELECTRONIC DISPLAY LAYERS

(71) Applicant: Manufacturing Resources International, Inc., Alpharetta, GA (US)

(72) Inventors: William Dunn, Alpharetta, GA (US); Mike Brown, Cumming, GA (US); Alex Moreau, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/920,434

(22) Filed: Oct. 18, 2024

(65) Prior Publication Data

US 2025/0044842 A1 Feb. 6, 2025

Related U.S. Application Data

(63) Continuation of application No. 18/609,896, filed on Mar. 19, 2024, now Pat. No. 12,153,479, which is a
(Continued)

(51) Int. Cl.
*G06F 1/20* (2006.01)
*G06F 1/18* (2006.01)
(Continued)

(52) U.S. Cl.
CPC ............... *G06F 1/181* (2013.01); *G06F 1/20* (2013.01); *G09F 9/33* (2013.01); *H05K 7/20972* (2013.01)

(58) Field of Classification Search
CPC ........ G06F 1/181; G06F 1/20; H05K 7/20972
(Continued)

(56) References Cited

U.S. PATENT DOCUMENTS

| | | |
|---|---|---|
| 4,093,355 A | 6/1978 | Kaplit et al. |
| 4,292,370 A | 9/1981 | Pekko |

(Continued)

FOREIGN PATENT DOCUMENTS

| | | |
|---|---|---|
| AU | 2011248190 B2 | 5/2011 |
| AU | 2014287438 B2 | 1/2018 |

(Continued)

OTHER PUBLICATIONS

Mentley, David E., State of Flat-Panel Display Technology and Future Trends, Proceedings of the IEEE, Apr. 2002, vol. 90, No. 4, pp. 453-459.

(Continued)

*Primary Examiner* — Christopher M Raabe
(74) *Attorney, Agent, or Firm* — Standley Law Group LLP; Jeffrey S. Standley; Adam J. Smith

(57) ABSTRACT

Display assemblies for preventing delamination of an optical stack are disclosed. A continuous, interconnected airflow pathway includes each of a first, second, and third airflow passageways, where the first airflow passageway is located, at least in part, forward of the optical stack, the second airflow passageway is located, at least in part, rearward of the optical stack, and the third airflow passageway is located, at least in part, rearward of the second airflow passageway. One or more fan units are positioned along the continuous, interconnected airflow pathway, and when activated, push gas through the continuous, interconnected airflow pathway, including into the first and second airflow passageways to generate compressive forces by the gas at the optical stack.

20 Claims, 12 Drawing Sheets

Related U.S. Application Data continuation of application No. 17/387,438, filed on Jul. 28, 2021, now Pat. No. 11,966,263.

(51) Int. Cl.
  *G09F 9/33* (2006.01)
  *H05K 7/20* (2006.01)

(58) Field of Classification Search
  USPC .......................................................... 361/688
  See application file for complete search history.

(56) References Cited

U.S. PATENT DOCUMENTS

| | | |
|---|---|---|
| 4,327,803 A | 5/1982 | Muellejans et al. |
| 4,488,193 A | 12/1984 | Davis et al. |
| 4,593,978 A | 6/1986 | Mourey et al. |
| 4,634,225 A | 1/1987 | Haim et al. |
| 4,748,765 A | 6/1988 | Martin |
| 4,763,993 A | 8/1988 | Vogeley et al. |
| 4,921,041 A | 5/1990 | Akachi |
| 4,952,783 A | 8/1990 | Aufderheide et al. |
| 4,952,925 A | 8/1990 | Haastert |
| 4,976,536 A | 12/1990 | Vogeley et al. |
| 5,002,118 A | 3/1991 | Olmstead et al. |
| 5,029,982 A | 7/1991 | Nash |
| 5,088,806 A | 2/1992 | McCartney et al. |
| 5,132,666 A | 7/1992 | Fahs |
| 5,150,231 A | 9/1992 | Iwamoto et al. |
| 5,247,374 A | 9/1993 | Terada |
| 5,255,029 A | 10/1993 | Vogeley et al. |
| 5,282,114 A | 1/1994 | Stone |
| 5,285,677 A | 2/1994 | Oehler |
| 5,293,930 A | 3/1994 | Pitasi |
| 5,351,176 A | 9/1994 | Smith et al. |
| 5,432,526 A | 7/1995 | Hyatt |
| 5,535,816 A | 7/1996 | Ishida |
| 5,559,614 A | 9/1996 | Urbish et al. |
| 5,621,614 A | 4/1997 | O'Neill |
| 5,657,641 A | 8/1997 | Cunningham et al. |
| 5,748,269 A | 5/1998 | Harris et al. |
| 5,765,743 A | 6/1998 | Sakiura et al. |
| 5,767,489 A | 6/1998 | Ferrier |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,903,433 A | 5/1999 | Gudmundsson |
| 5,920,367 A | 7/1999 | Kajimoto et al. |
| 5,991,153 A | 11/1999 | Heady et al. |
| 6,003,015 A | 12/1999 | Kang et al. |
| 6,007,205 A | 12/1999 | Fujimori |
| 6,043,979 A | 3/2000 | Shim |
| 6,089,751 A | 7/2000 | Conover et al. |
| 6,104,451 A | 8/2000 | Matsuoka et al. |
| 6,125,565 A | 10/2000 | Hillstrom |
| 6,157,432 A | 12/2000 | Helbing |
| 6,181,070 B1 | 1/2001 | Dunn et al. |
| 6,191,839 B1 | 2/2001 | Briley et al. |
| 6,198,222 B1 | 3/2001 | Chang |
| 6,211,934 B1 | 4/2001 | Habing et al. |
| 6,215,655 B1 | 4/2001 | Heady et al. |
| 6,244,333 B1 | 6/2001 | Bergh et al. |
| 6,351,381 B1 | 2/2002 | Bilski et al. |
| 6,359,390 B1 | 3/2002 | Nagai |
| 6,392,727 B1 | 5/2002 | Larson et al. |
| 6,405,463 B1 | 6/2002 | Roddy et al. |
| 6,417,900 B1 | 7/2002 | Shin et al. |
| 6,428,198 B1 | 8/2002 | Saccomanno et al. |
| 6,437,673 B1 | 8/2002 | Nishida et al. |
| 6,473,150 B1 | 10/2002 | Takushima et al. |
| 6,476,883 B1 | 11/2002 | Salimes et al. |
| 6,493,440 B2 | 12/2002 | Gromatsky et al. |
| 6,496,236 B1 | 12/2002 | Cole et al. |
| 6,504,713 B1 | 1/2003 | Pandolfi et al. |
| 6,535,266 B1 | 3/2003 | Nemeth et al. |
| 6,628,355 B1 | 9/2003 | Takahara |
| 6,643,130 B1 | 11/2003 | DeMarchis et al. |
| 6,683,639 B2 | 1/2004 | Driessen-Olde Scheper et al. |
| 6,701,143 B1 | 3/2004 | Dukach et al. |
| 6,714,410 B2 | 3/2004 | Wellhofer |
| 6,727,468 B1 | 4/2004 | Nemeth |
| 6,742,583 B2 | 6/2004 | Tikka |
| 6,800,378 B2 | 10/2004 | Hawa et al. |
| 6,807,051 B2 | 10/2004 | Takahashi |
| 6,812,851 B1 | 11/2004 | Dukach et al. |
| 6,825,828 B2 | 11/2004 | Burke et al. |
| 6,833,992 B2 | 12/2004 | Kusaka et al. |
| 6,839,104 B2 | 1/2005 | Taniguchi et al. |
| 6,850,209 B2 | 2/2005 | Mankins et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 7,015,470 B2 | 3/2006 | Faytlin et al. |
| 7,059,757 B2 | 6/2006 | Shimizu |
| 7,083,285 B2 | 8/2006 | Hsu et al. |
| 7,157,838 B2 | 1/2007 | Thielemans et al. |
| 7,161,803 B1 | 1/2007 | Heady |
| 7,164,586 B2 | 1/2007 | Lin |
| 7,170,759 B2 | 1/2007 | Soga |
| 7,190,416 B2 | 3/2007 | Paukshto et al. |
| 7,190,587 B2 | 3/2007 | Kim et al. |
| 7,209,349 B2 | 4/2007 | Chien et al. |
| 7,210,839 B2 | 5/2007 | Jung et al. |
| 7,212,403 B2 | 5/2007 | Rockenfell |
| 7,259,964 B2 | 8/2007 | Yamamura et al. |
| 7,269,023 B2 | 9/2007 | Nagano |
| 7,284,874 B2 | 10/2007 | Jeong et al. |
| 7,342,789 B2 | 3/2008 | Hall et al. |
| 7,396,145 B2 | 7/2008 | Wang et al. |
| 7,447,018 B2 | 11/2008 | Lee et al. |
| 7,452,121 B2 | 11/2008 | Cho et al. |
| 7,457,113 B2 | 11/2008 | Kumhyr et al. |
| 7,458,767 B2 | 12/2008 | Wu et al. |
| 7,466,546 B2 | 12/2008 | Park |
| 7,480,140 B2 | 1/2009 | Hara et al. |
| 7,492,589 B2 | 2/2009 | Park |
| 7,518,864 B2 | 4/2009 | Kimura |
| 7,529,088 B2 | 5/2009 | Chiu et al. |
| 7,535,543 B2 | 5/2009 | Dewa et al. |
| 7,591,508 B2 | 9/2009 | Chang |
| 7,602,469 B2 | 10/2009 | Shin |
| D608,775 S | 1/2010 | Leung |
| 7,667,964 B2 | 2/2010 | Kang et al. |
| 7,682,047 B2 | 3/2010 | Hsu et al. |
| 7,752,858 B2 | 7/2010 | Johnson et al. |
| 7,753,567 B2 | 7/2010 | Kang et al. |
| 7,762,707 B2 | 7/2010 | Kim et al. |
| 7,800,706 B2 | 9/2010 | Kim et al. |
| 7,813,124 B2 | 10/2010 | Karppanen |
| 7,864,258 B2 | 1/2011 | Cho et al. |
| 7,868,951 B2 | 1/2011 | Maruta et al. |
| 7,903,416 B2 | 3/2011 | Chou |
| 7,995,342 B2 | 8/2011 | Nakamichi et al. |
| 8,004,648 B2 | 8/2011 | Dunn |
| 8,035,968 B2 | 10/2011 | Kwon et al. |
| 8,081,267 B2 | 12/2011 | Moscovitch et al. |
| 8,081,465 B2 | 12/2011 | Nishiura |
| 8,102,173 B2 | 1/2012 | Merrow |
| 8,102,483 B2 | 1/2012 | Perry et al. |
| 8,142,027 B2 | 3/2012 | Sakai |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |

(56) References Cited

U.S. PATENT DOCUMENTS

| | | |
|---|---|---|
| 8,274,622 B2 | 9/2012 | Dunn |
| 8,274,789 B2 | 9/2012 | Nakamichi et al. |
| 8,300,203 B2 | 10/2012 | Nakamichi et al. |
| 8,310,824 B2 | 11/2012 | Dunn et al. |
| 8,320,119 B2 | 11/2012 | Isoshima et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,462,497 B2 | 6/2013 | Li et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,590,602 B2 | 11/2013 | Fernandez |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,827,472 B2 | 9/2014 | Takada |
| 8,854,572 B2 | 10/2014 | Dunn |
| 8,854,595 B2 | 10/2014 | Dunn |
| 8,879,042 B2 | 11/2014 | Dunn |
| 8,976,313 B2 | 3/2015 | Kim et al. |
| 8,988,647 B2 | 3/2015 | Hubbard |
| 9,030,641 B2 | 5/2015 | Dunn |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,282,676 B1 | 3/2016 | Diaz |
| 9,285,108 B2 | 3/2016 | Dunn et al. |
| 9,313,917 B2 | 4/2016 | Dunn et al. |
| 9,335,579 B2 | 5/2016 | Onoue |
| 9,338,923 B2 | 5/2016 | Lee et al. |
| 9,357,673 B2 | 5/2016 | Chin |
| 9,370,127 B2 | 6/2016 | Dunn |
| 9,414,516 B2 | 8/2016 | Chin et al. |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,504,188 B1 | 11/2016 | Campbell et al. |
| 9,516,485 B1 | 12/2016 | Bowers et al. |
| 9,549,490 B2 | 1/2017 | Hubbard |
| 9,594,271 B2 | 3/2017 | Dunn et al. |
| 9,600,026 B2 | 3/2017 | Birgeoglu et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |
| 9,703,230 B2 | 7/2017 | Bowers et al. |
| 9,723,765 B2 | 8/2017 | DeMars |
| 9,743,553 B2 | 8/2017 | Kim et al. |
| 9,756,739 B2 | 9/2017 | Russell-Clarke et al. |
| 9,797,588 B2 | 10/2017 | Dunn et al. |
| 9,801,305 B2 | 10/2017 | Dunn et al. |
| 9,823,690 B2 | 11/2017 | Bowers et al. |
| 9,835,893 B2 | 12/2017 | Dunn |
| 9,857,618 B2 | 1/2018 | Barnes |
| 9,861,007 B2 | 1/2018 | Yoon et al. |
| 9,894,800 B2 | 2/2018 | Dunn |
| 10,070,540 B2 | 9/2018 | Campagna et al. |
| 10,080,316 B2 | 9/2018 | Dunn et al. |
| 10,088,702 B2 | 10/2018 | Dunn et al. |
| 10,165,712 B1 | 12/2018 | Jang et al. |
| 10,180,591 B2 | 1/2019 | Lee et al. |
| 10,194,564 B2 | 1/2019 | Dunn et al. |
| 10,212,845 B2 | 2/2019 | Dunn et al. |
| 10,278,311 B2 | 4/2019 | DeMars |
| 10,278,312 B1 | 4/2019 | Davis et al. |
| 10,306,781 B2 | 5/2019 | Cho et al. |
| 10,314,212 B2 | 6/2019 | Hubbard |
| 10,359,659 B2 | 7/2019 | Dunn et al. |
| 10,359,817 B2 | 7/2019 | Yun et al. |
| 10,383,238 B2 | 8/2019 | Yun et al. |
| 10,398,066 B2 | 8/2019 | Dunn et al. |
| 10,405,456 B2 | 9/2019 | Jang et al. |
| 10,409,323 B2 | 9/2019 | Birgeoglu et al. |
| 10,420,257 B2 | 9/2019 | Dunn et al. |
| 10,485,113 B2 | 11/2019 | Dunn et al. |
| 10,485,147 B2 | 11/2019 | Oh et al. |
| 10,485,148 B2 | 11/2019 | Oh et al. |
| 10,488,896 B2 | 11/2019 | Simpson |
| 10,499,516 B2 | 12/2019 | Dunn et al. |
| 10,506,738 B2 | 12/2019 | Dunn |
| 10,506,740 B2 | 12/2019 | Dunn et al. |
| 10,524,384 B2 | 12/2019 | Dunn et al. |
| 10,524,397 B2 | 12/2019 | Dunn et al. |
| 10,548,247 B2 | 1/2020 | Demars |
| 10,624,218 B2 | 4/2020 | Dunn et al. |
| 10,660,245 B2 | 5/2020 | Dunn et al. |
| 10,687,446 B2 | 6/2020 | Dunn et al. |
| 10,716,224 B2 | 7/2020 | Dunn et al. |
| 10,721,836 B2 | 7/2020 | Dunn et al. |
| 10,736,245 B2 | 8/2020 | Dunn et al. |
| 10,747,261 B2 | 8/2020 | Birgeoglu et al. |
| 10,754,184 B2 | 8/2020 | Wang et al. |
| 10,757,844 B2 | 8/2020 | Dunn et al. |
| 10,795,413 B1 | 10/2020 | Dunn |
| 10,820,445 B2 | 10/2020 | Diaz |
| 10,827,656 B2 | 11/2020 | Hubbard |
| 10,827,657 B2 | 11/2020 | Lee |
| 10,905,035 B2 | 1/2021 | Whitehead et al. |
| 10,925,174 B2 | 2/2021 | Dunn et al. |
| 10,969,615 B2 | 4/2021 | Wang et al. |
| 10,973,156 B2 | 4/2021 | Dunn et al. |
| 10,983,382 B2 | 4/2021 | Takase |
| 11,013,142 B2 | 5/2021 | Dunn et al. |
| 11,016,547 B2 | 5/2021 | Whitehead et al. |
| 11,019,735 B2 | 5/2021 | Dunn |
| 11,032,923 B2 | 6/2021 | Dunn et al. |
| 11,096,317 B2 | 8/2021 | Dunn |
| 11,191,193 B2 | 11/2021 | Hubbard |
| 11,206,750 B2 | 12/2021 | Lee et al. |
| 11,470,749 B2 | 10/2022 | Dunn et al. |
| 11,477,923 B2 | 10/2022 | Brown |
| 11,507,141 B2 | 11/2022 | Dunn |
| 11,540,418 B2 | 12/2022 | Dunn et al. |
| 11,596,081 B2 | 2/2023 | Dunn et al. |
| 11,617,287 B2 | 3/2023 | Dunn |
| 11,744,036 B2 | 8/2023 | Diaz |
| 11,744,054 B2 | 8/2023 | Dunn et al. |
| 11,762,231 B2 | 9/2023 | Dunn et al. |
| 11,822,171 B2 | 11/2023 | Dunn et al. |
| 11,889,636 B2 | 1/2024 | Dunn |
| 11,914,241 B1* | 2/2024 | Zhang ............... G02F 1/133385 |
| 11,919,393 B2 | 3/2024 | Dunn et al. |
| 11,934,054 B2 | 3/2024 | Dunn et al. |
| 11,966,263 B2 | 4/2024 | Dunn et al. |
| 11,968,813 B2 | 4/2024 | Dunn et al. |
| 11,989,059 B2 | 5/2024 | Dunn |
| 12,004,310 B2 | 6/2024 | Dunn et al. |
| 12,004,311 B2 | 6/2024 | Dunn |
| 12,010,813 B2 | 6/2024 | Dunn et al. |
| 12,010,824 B2 | 6/2024 | Dunn |
| 12,035,486 B1 | 7/2024 | Dunn et al. |

(56) References Cited

U.S. PATENT DOCUMENTS

| | | |
|---|---|---|
| 12,052,850 B2 | 7/2024 | Brown |
| 2001/0001459 A1 | 5/2001 | Savant et al. |
| 2001/0019454 A1 | 9/2001 | Tadic-Galeb et al. |
| 2001/0023914 A1 | 9/2001 | Oddsen, Jr. |
| 2001/0032404 A1 | 10/2001 | Hillstrom |
| 2002/0009978 A1 | 1/2002 | Dukach et al. |
| 2002/0033919 A1 | 3/2002 | Sanelle et al. |
| 2002/0050793 A1 | 5/2002 | Cull et al. |
| 2002/0065046 A1 | 5/2002 | Mankins et al. |
| 2002/0084891 A1 | 7/2002 | Mankins et al. |
| 2002/0101553 A1 | 8/2002 | Enomoto et al. |
| 2002/0112026 A1 | 8/2002 | Fridman et al. |
| 2002/0122134 A1 | 9/2002 | Kalua |
| 2002/0126248 A1 | 9/2002 | Yoshida |
| 2002/0135741 A1 | 9/2002 | Lee et al. |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020679 A1 | 1/2003 | Kojima et al. |
| 2003/0020884 A1 | 1/2003 | Okada et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0025389 A1 | 2/2004 | Peterson |
| 2004/0035032 A1 | 2/2004 | Milliken |
| 2004/0035558 A1 | 2/2004 | Todd et al. |
| 2004/0036622 A1 | 2/2004 | Dukach et al. |
| 2004/0036834 A1 | 2/2004 | Ohnishi et al. |
| 2004/0042174 A1 | 3/2004 | Tomioka et al. |
| 2004/0103570 A1 | 6/2004 | Ruttenberg |
| 2004/0105159 A1 | 6/2004 | Saccomanno et al. |
| 2004/0135482 A1 | 7/2004 | Thielemans et al. |
| 2004/0165139 A1 | 8/2004 | Anderson et al. |
| 2004/0207981 A1 | 10/2004 | Gorenz, Jr. et al. |
| 2004/0212548 A1 | 10/2004 | Ruttenberg |
| 2004/0223299 A1 | 11/2004 | Ghosh |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0094039 A1 | 5/2005 | Kim et al. |
| 2005/0127796 A1 | 6/2005 | Olesen et al. |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0219841 A1 | 10/2005 | Ikeda et al. |
| 2005/0229630 A1 | 10/2005 | Richter et al. |
| 2005/0237714 A1 | 10/2005 | Ebermann |
| 2005/0253699 A1 | 11/2005 | Madonia |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0012985 A1 | 1/2006 | Archie et al. |
| 2006/0018093 A1 | 1/2006 | Lai et al. |
| 2006/0034050 A1 | 2/2006 | Wang et al. |
| 2006/0034051 A1 | 2/2006 | Wang et al. |
| 2006/0056994 A1 | 3/2006 | Van Lear et al. |
| 2006/0077636 A1 | 4/2006 | Kim |
| 2006/0081366 A1 | 4/2006 | Chiu et al. |
| 2006/0081367 A1 | 4/2006 | Chiu et al. |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0133090 A1 | 6/2006 | Noh et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0221270 A1 | 10/2006 | Ioki et al. |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0266900 A1 | 11/2006 | May et al. |
| 2006/0268194 A1 | 11/2006 | Morimoto et al. |
| 2006/0269216 A1 | 11/2006 | Wiemeyer et al. |
| 2006/0283579 A1 | 12/2006 | Ghosh et al. |
| 2007/0013647 A1 | 1/2007 | Lee et al. |
| 2007/0019419 A1 | 1/2007 | Hafuka et al. |
| 2007/0021217 A1 | 1/2007 | Wu et al. |
| 2007/0030879 A1 | 2/2007 | Hatta |
| 2007/0046874 A1 | 3/2007 | Adachi et al. |
| 2007/0047239 A1 | 3/2007 | Kang et al. |
| 2007/0065091 A1 | 3/2007 | Hinata et al. |
| 2007/0070615 A1 | 3/2007 | Joslin et al. |
| 2007/0076431 A1 | 4/2007 | Atarashi et al. |
| 2007/0081344 A1 | 4/2007 | Cappaert et al. |
| 2007/0103863 A1 | 5/2007 | Kim |
| 2007/0103866 A1 | 5/2007 | Park |
| 2007/0115686 A1 | 5/2007 | Tyberghien |
| 2007/0126335 A1 | 6/2007 | You et al. |
| 2007/0139929 A1 | 6/2007 | Yoo et al. |
| 2007/0140671 A1 | 6/2007 | Yoshimura |
| 2007/0144704 A1 | 6/2007 | Bundza et al. |
| 2007/0151164 A1 | 7/2007 | Marshall |
| 2007/0151274 A1 | 7/2007 | Roche et al. |
| 2007/0151664 A1 | 7/2007 | Shin |
| 2007/0171353 A1 | 7/2007 | Hong |
| 2007/0176885 A1 | 8/2007 | Jun |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0253205 A1 | 11/2007 | Welker |
| 2007/0267174 A1 | 11/2007 | Kim |
| 2007/0274051 A1 | 11/2007 | Horng et al. |
| 2008/0035315 A1 | 2/2008 | Han |
| 2008/0054144 A1 | 3/2008 | Wohlford |
| 2008/0055261 A1 | 3/2008 | Cernasov |
| 2008/0055534 A1 | 3/2008 | Kawano |
| 2008/0076342 A1 | 3/2008 | Bryant et al. |
| 2008/0083527 A1 | 4/2008 | Horng et al. |
| 2008/0099193 A1 | 5/2008 | Aksamit et al. |
| 2008/0111936 A1 | 5/2008 | Kim |
| 2008/0148609 A1 | 6/2008 | Ogoreve |
| 2008/0165496 A1 | 7/2008 | Kang et al. |
| 2008/0190210 A1 | 8/2008 | Harish et al. |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2008/0296134 A1 | 12/2008 | Hattori et al. |
| 2008/0310116 A1 | 12/2008 | O'Connor |
| 2008/0310158 A1 | 12/2008 | Harbers et al. |
| 2009/0009047 A1 | 1/2009 | Yanagawa et al. |
| 2009/0009729 A1 | 1/2009 | Sakai |
| 2009/0021461 A1 | 1/2009 | Hu et al. |
| 2009/0034188 A1 | 2/2009 | Sween et al. |
| 2009/0059518 A1 | 3/2009 | Kakikawa et al. |
| 2009/0065007 A1 | 3/2009 | Wilkinson et al. |
| 2009/0086430 A1 | 4/2009 | Kang et al. |
| 2009/0095819 A1 | 4/2009 | Brown et al. |
| 2009/0104989 A1 | 4/2009 | Williams et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0129021 A1 | 5/2009 | Dunn |
| 2009/0135365 A1 | 5/2009 | Dunn |
| 2009/0145581 A1 | 6/2009 | Hoffman et al. |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0231807 A1 | 9/2009 | Bouissiere |

(56) References Cited

U.S. PATENT DOCUMENTS

| | | |
|---|---|---|
| 2009/0241437 A1 | 10/2009 | Steinle et al. |
| 2009/0244472 A1 | 10/2009 | Dunn |
| 2009/0266507 A1 | 10/2009 | Turnbull et al. |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2009/0323275 A1 | 12/2009 | Rehmann et al. |
| 2010/0060861 A1 | 3/2010 | Medin |
| 2010/0079949 A1 | 4/2010 | Nakamichi et al. |
| 2010/0079979 A1 | 4/2010 | Nakamichi et al. |
| 2010/0142149 A1 | 6/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1 | 9/2010 | Nakamichi et al. |
| 2010/0226091 A1 | 9/2010 | Dunn |
| 2010/0232107 A1 | 9/2010 | Dunn |
| 2010/0238394 A1 | 9/2010 | Dunn |
| 2010/0315570 A1 | 12/2010 | Mathew et al. |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0032489 A1 | 2/2011 | Kimoto et al. |
| 2011/0051071 A1 | 3/2011 | Nakamichi et al. |
| 2011/0051369 A1 | 3/2011 | Takahara |
| 2011/0058326 A1 | 3/2011 | Idems et al. |
| 2011/0072697 A1 | 3/2011 | Miller |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1 | 4/2011 | Dunn |
| 2011/0085302 A1 | 4/2011 | Nakamichi et al. |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1 | 5/2011 | Sato et al. |
| 2011/0134356 A1 | 6/2011 | Swatt et al. |
| 2011/0141672 A1 | 6/2011 | Farley, Jr. et al. |
| 2011/0141724 A1 | 6/2011 | Erion |
| 2011/0162831 A1 | 7/2011 | Lee et al. |
| 2011/0167845 A1 | 7/2011 | Lee et al. |
| 2011/0261523 A1 | 10/2011 | Dunn et al. |
| 2011/0297810 A1 | 12/2011 | Tachibana |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0105790 A1 | 5/2012 | Hubbard |
| 2012/0106081 A1 | 5/2012 | Hubbard et al. |
| 2012/0131936 A1 | 5/2012 | Yoshida et al. |
| 2012/0188481 A1 | 7/2012 | Kang et al. |
| 2012/0206687 A1 | 8/2012 | Dunn et al. |
| 2012/0223877 A1 | 9/2012 | Cho |
| 2012/0224116 A1 | 9/2012 | Barnes |
| 2012/0236499 A1 | 9/2012 | Murayama et al. |
| 2012/0249402 A1 | 10/2012 | Kang |
| 2012/0255704 A1 | 10/2012 | Nakamichi |
| 2012/0274876 A1 | 11/2012 | Cappaert et al. |
| 2012/0284547 A1 | 11/2012 | Culbert et al. |
| 2012/0327600 A1 | 12/2012 | Dunn |
| 2013/0170140 A1 | 7/2013 | Dunn |
| 2013/0173358 A1 | 7/2013 | Pinkus |
| 2013/0176517 A1 | 7/2013 | Kim et al. |
| 2013/0201685 A1 | 8/2013 | Messmore et al. |
| 2013/0258659 A1 | 10/2013 | Erion |
| 2013/0279154 A1 | 10/2013 | Dunn |
| 2013/0294039 A1 | 11/2013 | Chao |
| 2013/0299651 A1 | 11/2013 | McGowan et al. |
| 2013/0344794 A1 | 12/2013 | Shaw et al. |
| 2014/0044147 A1 | 2/2014 | Wyatt et al. |
| 2014/0085564 A1 | 3/2014 | Hendren et al. |
| 2014/0111758 A1 | 4/2014 | Dunn et al. |
| 2014/0113540 A1 | 4/2014 | Dunn et al. |
| 2014/0134767 A1 | 5/2014 | Ishida et al. |
| 2014/0184980 A1 | 7/2014 | Onoue |
| 2014/0190240 A1 | 7/2014 | He et al. |
| 2014/0268657 A1 | 9/2014 | Dunn et al. |
| 2014/0313452 A1 | 10/2014 | Dunn et al. |
| 2014/0313666 A1 | 10/2014 | Chin |
| 2014/0313698 A1 | 10/2014 | Dunn et al. |
| 2014/0314395 A1 | 10/2014 | Dunn et al. |
| 2014/0334100 A1 | 11/2014 | Yoon et al. |
| 2014/0361138 A1 | 12/2014 | Ramirez et al. |
| 2015/0009625 A1 | 1/2015 | Chin et al. |
| 2015/0009627 A1 | 1/2015 | Dunn et al. |
| 2015/0087404 A1 | 3/2015 | Lesley et al. |
| 2015/0173237 A1 | 6/2015 | Lin et al. |
| 2015/0192371 A1 | 7/2015 | Hancock |
| 2015/0253611 A1 | 9/2015 | Yang et al. |
| 2015/0264826 A1 | 9/2015 | Dunn et al. |
| 2015/0319882 A1 | 11/2015 | Dunn et al. |
| 2015/0366101 A1 | 12/2015 | Dunn et al. |
| 2015/0371571 A1 | 12/2015 | Häger |
| 2016/0014910 A1 | 1/2016 | Campagna et al. |
| 2016/0041423 A1 | 2/2016 | Dunn |
| 2016/0044829 A1 | 2/2016 | Dunn |
| 2016/0162297 A1 | 6/2016 | Shao |
| 2016/0192536 A1 | 6/2016 | Diaz |
| 2016/0195254 A1 | 7/2016 | Dunn et al. |
| 2016/0198588 A1 | 7/2016 | DeMars |
| 2016/0238876 A1 | 8/2016 | Dunn et al. |
| 2016/0242329 A1 | 8/2016 | DeMars |
| 2016/0242330 A1 | 8/2016 | Dunn |
| 2016/0249493 A1 | 8/2016 | Dunn et al. |
| 2016/0265759 A1 | 9/2016 | Na et al. |
| 2016/0302331 A1 | 10/2016 | Dunn |
| 2017/0023823 A1 | 1/2017 | Dunn et al. |
| 2017/0068042 A1 | 3/2017 | Dunn et al. |
| 2017/0074453 A1 | 3/2017 | Bowers et al. |
| 2017/0083043 A1 | 3/2017 | Bowers et al. |
| 2017/0083062 A1 | 3/2017 | Bowers et al. |
| 2017/0111486 A1 | 4/2017 | Bowers et al. |
| 2017/0111520 A1 | 4/2017 | Bowers et al. |
| 2017/0111521 A1 | 4/2017 | Bowers et al. |
| 2017/0127579 A1 | 5/2017 | Hubbard |
| 2017/0140344 A1 | 5/2017 | Bowers et al. |
| 2017/0147992 A1 | 5/2017 | Bowers et al. |
| 2017/0163519 A1 | 6/2017 | Bowers et al. |
| 2017/0172016 A1 | 6/2017 | Kang |
| 2017/0175411 A1 | 6/2017 | Bowers et al. |
| 2017/0188490 A1 | 6/2017 | Dunn et al. |
| 2017/0231112 A1 | 8/2017 | Dunn et al. |
| 2017/0245400 A1 | 8/2017 | Dunn et al. |
| 2017/0257978 A1 | 9/2017 | Diaz |
| 2017/0332523 A1 | 11/2017 | DeMars |
| 2017/0345346 A1 | 11/2017 | Hong et al. |
| 2018/0020579 A1 | 1/2018 | Chang et al. |
| 2018/0042134 A1 | 2/2018 | Dunn et al. |
| 2018/0088368 A1 | 3/2018 | Notoshi et al. |
| 2018/0088398 A1 | 3/2018 | Lee et al. |
| 2018/0116073 A1 | 4/2018 | Dunn |
| 2018/0199450 A1 | 7/2018 | Kim et al. |
| 2018/0259806 A1 | 9/2018 | Oh et al. |
| 2018/0263142 A1 | 9/2018 | Oh et al. |
| 2018/0310439 A1 | 10/2018 | Oh et al. |
| 2018/0314103 A1 | 11/2018 | Dunn et al. |
| 2018/0315356 A1 | 11/2018 | Dunn et al. |
| 2018/0317330 A1 | 11/2018 | Dunn et al. |
| 2018/0317350 A1 | 11/2018 | Dunn et al. |
| 2018/0364519 A1 | 12/2018 | Dunn et al. |
| 2019/0021189 A1 | 1/2019 | Kim et al. |
| 2019/0037738 A1 | 1/2019 | Dunn et al. |
| 2019/0089176 A1 | 3/2019 | Dunn et al. |
| 2019/0133002 A1 | 5/2019 | Dunn et al. |
| 2019/0159363 A1 | 5/2019 | Jang et al. |
| 2019/0208674 A1 | 7/2019 | Demars |
| 2019/0239365 A1 | 8/2019 | Dunn et al. |
| 2019/0289754 A1 | 9/2019 | Hubbard |
| 2019/0327865 A1 | 10/2019 | Dunn et al. |
| 2020/0033017 A1 | 1/2020 | Brown et al. |

(56) References Cited

U.S. PATENT DOCUMENTS

| | | |
|---|---|---|
| 2020/0096797 A1 | 3/2020 | Teragawa |
| 2020/0154597 A1 | 5/2020 | Dunn et al. |
| 2020/0163235 A1 | 5/2020 | Dunn |
| 2020/0201402 A1 | 6/2020 | Lee et al. |
| 2020/0205303 A1 | 6/2020 | Dunn et al. |
| 2020/0241612 A1 | 7/2020 | Moon et al. |
| 2020/0253095 A1 | 8/2020 | Dunn et al. |
| 2020/0275585 A1 | 8/2020 | Dunn |
| 2020/0288585 A1 | 9/2020 | Dunn et al. |
| 2020/0319676 A1 | 10/2020 | Dunn |
| 2020/0352049 A1 | 11/2020 | Dunn et al. |
| 2020/0367391 A1 | 11/2020 | Dunn |
| 2020/0369169 A1 | 11/2020 | Mercer et al. |
| 2020/0387194 A1 | 12/2020 | Dunn |
| 2020/0390009 A1 | 12/2020 | Whitehead et al. |
| 2021/0007241 A1 | 1/2021 | Diaz |
| 2021/0022273 A1 | 1/2021 | Hubbard |
| 2021/0165472 A1 | 6/2021 | Chin |
| 2021/0168949 A1 | 6/2021 | Dunn et al. |
| 2021/0231998 A1 | 7/2021 | Noso et al. |
| 2021/0243906 A1 | 8/2021 | Dunn |
| 2021/0243914 A1 | 8/2021 | Dunn |
| 2021/0304644 A1 | 9/2021 | Webster |
| 2021/0307214 A1 | 9/2021 | Zhang et al. |
| 2021/0345528 A1 | 11/2021 | Dunn |
| 2021/0397010 A1 | 12/2021 | Mou et al. |
| 2021/0400853 A1 | 12/2021 | Choi |
| 2021/0408676 A1 | 12/2021 | Sainz Fuertes |
| 2022/0035198 A1 | 2/2022 | Dunn et al. |
| 2022/0110227 A1 | 4/2022 | Brown |
| 2022/0121255 A1 | 4/2022 | Wang et al. |
| 2022/0132707 A1 | 4/2022 | Dunn et al. |
| 2022/0252927 A1 | 8/2022 | Wang et al. |
| 2022/0287200 A1 | 9/2022 | Dunn et al. |
| 2022/0394861 A1 | 12/2022 | Dunn et al. |
| 2022/0408616 A1 | 12/2022 | Brown |
| 2022/0408617 A1 | 12/2022 | Brown |
| 2023/0030742 A1 | 2/2023 | Dunn et al. |
| 2023/0032626 A1 | 2/2023 | Brown |
| 2023/0033017 A1 | 2/2023 | Dunn |
| 2023/0036767 A1 | 2/2023 | Dunn et al. |
| 2023/0056061 A1 | 2/2023 | Dunn et al. |
| 2023/0059819 A1 | 2/2023 | Dunn et al. |
| 2023/0160774 A1 | 5/2023 | Dunn et al. |
| 2023/0164964 A1 | 5/2023 | Dunn et al. |
| 2023/0200031 A1 | 6/2023 | Dunn |
| 2023/0209786 A1 | 6/2023 | Dunn |
| 2023/0345683 A1 | 10/2023 | Dunn et al. |
| 2023/0359077 A1 | 11/2023 | Dunn et al. |
| 2023/0422431 A1 | 12/2023 | Dunn et al. |
| 2023/0422453 A1 | 12/2023 | Dunn |
| 2024/0032238 A1 | 1/2024 | Dunn et al. |
| 2024/0114633 A1 | 4/2024 | Dunn |
| 2024/0219980 A1 | 7/2024 | Dunn et al. |
| 2024/0264633 A1 | 8/2024 | Dunn |
| 2024/0268088 A1 | 8/2024 | Dunn et al. |
| 2024/0292561 A1 | 8/2024 | Dunn et al. |
| 2024/0292562 A1 | 8/2024 | Dunn et al. |
| 2024/0292563 A1 | 8/2024 | Dunn et al. |
| 2024/0292580 A1 | 8/2024 | Dunn |
| 2024/0306314 A1 | 9/2024 | Dunn et al. |
| 2024/0357776 A1* | 10/2024 | Jing .................. H05K 7/20272 |

FOREIGN PATENT DOCUMENTS

| | | |
|---|---|---|
| AU | 2015253128 B2 | 3/2018 |
| AU | 2017216500 B2 | 10/2018 |
| AU | 2015229457 B2 | 3/2019 |
| AU | 2016220308 B2 | 3/2019 |
| AU | 2017228430 B2 | 3/2020 |
| AU | 2018258497 B2 | 1/2021 |
| AU | 2018257648 B2 | 2/2021 |
| BR | PI0820231-1 | 2/2019 |
| CA | 2705814 C | 2/2018 |
| CA | 2947524 C | 4/2018 |
| CA | 2915261 C | 8/2018 |
| CA | 2798277 C | 6/2019 |
| CA | 2809019 C | 9/2019 |
| CA | 2888494 C | 9/2019 |
| CA | 2976116 C | 11/2020 |
| CA | 3015365 C | 8/2021 |
| CA | 3059972 C | 1/2022 |
| CA | 2942321 C | 6/2022 |
| CA | 3059928 C | 11/2022 |
| CN | 2702363 Y | 5/2005 |
| CN | 201228893 Y | 4/2009 |
| CN | 202838830 U | 3/2013 |
| CN | 104640422 A | 5/2015 |
| CN | 106304788 A | 1/2017 |
| CN | 107251671 A | 10/2017 |
| CN | 108700739 A | 10/2018 |
| CN | 107251671 B | 8/2019 |
| CN | 216697703 U | 6/2022 |
| EP | 1408476 A1 | 4/2004 |
| EP | 1647766 A2 | 4/2006 |
| EP | 1722559 A1 | 11/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2587175 A1 | 5/2013 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3040766 A1 | 7/2016 |
| EP | 3117693 A2 | 1/2017 |
| EP | 3259968 A1 | 12/2017 |
| EP | 3423886 A0 | 1/2019 |
| EP | 3468321 A1 | 4/2019 |
| EP | 3138372 B1 | 5/2019 |
| EP | 3117693 B1 | 8/2019 |
| EP | 2567283 B1 | 10/2019 |
| EP | 2909829 B1 | 2/2020 |
| EP | 3615978 A1 | 3/2020 |
| EP | 3616481 A1 | 3/2020 |
| EP | 3624574 A1 | 3/2020 |
| EP | 3468321 B1 | 4/2021 |
| EP | 3423886 B1 | 2/2022 |
| EP | 3259968 B1 | 4/2022 |
| EP | 4232870 A1 | 8/2023 |
| EP | 3615978 B1 | 1/2024 |
| EP | 3616481 B1 | 7/2024 |
| FR | 2893752 A1 | 5/2007 |
| GB | 2402205 A | 12/2004 |
| JP | 402062015 A | 3/1990 |
| JP | 402307080 A | 12/1990 |
| JP | 3153212 A | 7/1991 |
| JP | H497194 A | 3/1992 |
| JP | H06-2337 U | 1/1994 |
| JP | 6082745 A | 3/1994 |
| JP | H8-54834 A | 2/1996 |
| JP | H8-55567 A | 2/1996 |
| JP | 8115788 A | 5/1996 |
| JP | H8-152604 A | 6/1996 |
| JP | 8194437 A | 7/1996 |
| JP | H08-305301 A | 11/1996 |
| JP | 8339034 A | 12/1996 |
| JP | H9-160512 A | 6/1997 |
| JP | H09246766 A | 9/1997 |
| JP | H10152604 A | 6/1998 |
| JP | H-10222076 A | 8/1998 |
| JP | H11-68363 A | 3/1999 |
| JP | 11160727 A | 6/1999 |
| JP | H-11233967 A | 8/1999 |
| JP | H11296094 A | 10/1999 |
| JP | 2000-10501 A | 1/2000 |
| JP | 2000112033 A | 4/2000 |
| JP | 2000131682 A | 5/2000 |
| JP | 3118907 B2 | 10/2000 |
| JP | 2001209125 A | 8/2001 |
| JP | 2001209126 A | 8/2001 |
| JP | 2001326488 A | 11/2001 |
| JP | 2002-6282 A | 1/2002 |

(56) References Cited

FOREIGN PATENT DOCUMENTS

| | | |
|---|---|---|
| JP | 2002006757 A | 1/2002 |
| JP | 2002148714 A | 5/2002 |
| JP | 2002158475 A | 5/2002 |
| JP | 2003036032 A | 2/2003 |
| JP | 2003-76286 A | 3/2003 |
| JP | 2003-162228 A | 6/2003 |
| JP | 2003173147 A | 6/2003 |
| JP | 2004053749 A | 2/2004 |
| JP | 2004-199675 A | 7/2004 |
| JP | 2004193002 A | 7/2004 |
| JP | 2004285940 A | 10/2004 |
| JP | 2004286940 A | 10/2004 |
| JP | 2005017434 A | 1/2005 |
| JP | 2005017556 A | 1/2005 |
| JP | 2005134849 A | 5/2005 |
| JP | 2005181799 A | 7/2005 |
| JP | 2005265922 A | 9/2005 |
| JP | 2005292939 A | 10/2005 |
| JP | 2005332253 A | 12/2005 |
| JP | 2006010851 A | 1/2006 |
| JP | 2006-32890 A | 2/2006 |
| JP | 2006513577 A | 4/2006 |
| JP | 2006148047 A | 6/2006 |
| JP | 2006163217 A | 6/2006 |
| JP | 2006-176112 A | 7/2006 |
| JP | 2006198344 A | 8/2006 |
| JP | 2006293062 A | 10/2006 |
| JP | 2006317494 A | 11/2006 |
| JP | 2006-330196 A | 12/2006 |
| JP | 2007003638 A | 1/2007 |
| JP | 2007052951 A | 3/2007 |
| JP | 2007207595 A | 8/2007 |
| JP | 2007-293105 A | 11/2007 |
| JP | 09307257 A | 11/2007 |
| JP | 2007322718 A | 12/2007 |
| JP | 2008010361 A | 1/2008 |
| JP | 2008292743 A | 12/2008 |
| JP | 2010024624 A | 2/2010 |
| JP | 2010-102227 A | 5/2010 |
| JP | 2010-282109 A | 12/2010 |
| JP | 2011-14593 A | 1/2011 |
| JP | 2011-503663 A | 1/2011 |
| JP | 2011-75819 A | 4/2011 |
| JP | 2012-118130 A | 6/2012 |
| JP | 2012-133254 A | 7/2012 |
| JP | 2013-537721 A | 10/2013 |
| JP | 2014-225595 A | 12/2014 |
| JP | 6039450 B2 | 12/2016 |
| JP | 2017518526 A | 7/2017 |
| JP | 2018-511838 A | 4/2018 |
| JP | 6305564 B2 | 4/2018 |
| JP | 2019-512721 A | 5/2019 |
| JP | 6526245 B2 | 5/2019 |
| JP | 6688402 B2 | 4/2020 |
| JP | 6824440 B2 | 1/2021 |
| JP | 6858276 B2 | 3/2021 |
| KR | 20000000118 U | 1/2000 |
| KR | 200163508 Y1 | 7/2000 |
| KR | 20000047899 A | 7/2000 |
| KR | 200206768 Y1 | 12/2000 |
| KR | 20010044073 A | 6/2001 |
| KR | 200236278 Y1 | 10/2001 |
| KR | 10-2067751 B1 | 1/2002 |
| KR | 200286961 Y1 | 8/2002 |
| KR | 100673470 B1 | 1/2004 |
| KR | 1020040067701 A | 7/2004 |
| KR | 200366674 Y1 | 11/2004 |
| KR | 20050033986 A | 4/2005 |
| KR | 20050036254 A | 4/2005 |
| KR | 200401354 Y1 | 11/2005 |
| KR | 20060016469 A | 2/2006 |
| KR | 10-0563049 B1 | 3/2006 |
| KR | 20060054742 A | 5/2006 |
| KR | 10-2006-0070176 A | 6/2006 |
| KR | 20060091898 A | 8/2006 |
| KR | 20060120904 A | 11/2006 |
| KR | 100659339 B1 | 12/2006 |
| KR | 100666961 B1 | 1/2007 |
| KR | 20070002494 A | 1/2007 |
| KR | 1020070070675 A | 4/2007 |
| KR | 10-2007-0048300 A | 5/2007 |
| KR | 20070048296 A | 5/2007 |
| KR | 1020070048294 | 8/2007 |
| KR | 20080005024 A | 1/2008 |
| KR | 20080010091 A | 1/2008 |
| KR | 20080018486 A | 2/2008 |
| KR | 20080047241 A | 5/2008 |
| KR | 20090116368 A | 11/2009 |
| KR | 10-1153923 B1 | 6/2012 |
| KR | 10-2013-0126034 A | 11/2013 |
| KR | 101764381 B1 | 7/2017 |
| KR | 10-1847151 B1 | 4/2018 |
| KR | 10-1853885 B1 | 4/2018 |
| KR | 10-1868077 B1 | 6/2018 |
| KR | 10-1885884 B1 | 7/2018 |
| KR | 10-1894027 B1 | 8/2018 |
| KR | 10-1904363 B1 | 9/2018 |
| KR | 10-1958375 B1 | 3/2019 |
| KR | 10-2010515 B1 | 8/2019 |
| KR | 10-2063885 | 1/2020 |
| KR | 10-2104342 B1 | 4/2020 |
| KR | 10-2109072 B1 | 5/2020 |
| KR | 10-2165778 B1 | 10/2020 |
| KR | 10-2262912 B1 | 6/2021 |
| KR | 10-2267374 B1 | 6/2021 |
| KR | 10-2306650 B1 | 9/2021 |
| KR | 10-2379046 B1 | 3/2022 |
| KR | 10-2400990 B1 | 5/2022 |
| KR | 10-2501211 B1 | 2/2023 |
| RU | 2513043 C2 | 4/2014 |
| WO | WO2005079129 A1 | 8/2005 |
| WO | WO2007/116117 A1 | 10/2007 |
| WO | WO2007116116 A1 | 10/2007 |
| WO | WO2008050660 A2 | 5/2008 |
| WO | WO2008085138 A | 7/2008 |
| WO | WO2008/102050 A1 | 8/2008 |
| WO | WO2009/047390 A1 | 4/2009 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011069084 A3 | 6/2011 |
| WO | WO2011072217 A3 | 6/2011 |
| WO | WO2011140179 A2 | 11/2011 |
| WO | WO2011150078 A2 | 12/2011 |
| WO | WO2012021573 A2 | 2/2012 |
| WO | WO2012024426 A3 | 2/2012 |
| WO | WO2013/182733 A1 | 12/2013 |
| WO | WO2014062815 A1 | 4/2014 |
| WO | WO2014149773 A1 | 9/2014 |
| WO | WO2014150036 A1 | 9/2014 |
| WO | WO2015/138609 A2 | 9/2015 |
| WO | WO2015168375 A1 | 11/2015 |
| WO | WO2016/102980 A1 | 6/2016 |
| WO | WO2016102982 A1 | 6/2016 |
| WO | WO2016127613 A1 | 8/2016 |
| WO | WO2016133852 A1 | 8/2016 |
| WO | WO2017152166 A1 | 9/2017 |
| WO | WO2018/200260 A1 | 11/2018 |
| WO | WO2018/200905 A1 | 11/2018 |
| WO | WO2020/081687 A1 | 4/2020 |
| WO | WO2020/205305 A1 | 10/2020 |
| WO | WO2022/087488 A1 | 4/2022 |
| WO | WO2023/096738 A1 | 6/2023 |
| WO | WO2024/020185 A1 | 1/2024 |

OTHER PUBLICATIONS

Rohsenow, Warren M., Handbook of Heat Transfer, Third Edition, 1998, select chapters, 112 pages, McGraw-Hill.
The American Heritage College Dictionary, Third Edition, 1993, excerpt, 3 pages, Houghton Company. Civiq Smartscapes Llc. V

(56) References Cited

OTHER PUBLICATIONS

Manufacturing Resources International, Inc., Petition for Inter Partes. Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.
*CIVIQ Smartscapes LLC. V Manufacturing Resources International, Inc.*, Defendant's Amended Answer and Counterclaims to Plaintiff's First Amended Complaint, Filed Apr. 24, 2018, 240 pages.
*CIVIQ Smartscapes LLC. V Manufacturing Resources International, Inc.*, Memorandum Order re "rear surface of the electronic display" term construction, Mar. 5, 2019, 3 pages.
United States International Trade Commission, *Manufacturing Resources International, Inc. v Samsung Electronics Co., Ltd et al.*, in the Matter of Certain Outdoor and Semioutdoor Electronic Displays, Products Containing Same, and Components Thereof, Inv. No. 337-TA-1331, Final Initial Determination of Violation of Section 337, Public Version, Nov. 13, 2023, 325 pages.
Declaration of Robert Smith Gillespie, Certain Outdoor and Semi-outdoor Electronic Displays, Products, Containing same, and Components thereof, Jan. 17, 2023, 42 pages.
*Samsung Electronics Co., Ltd. and Samsung Electronics America, Inc. v Manufacturing Resources International, Inc.*, Declaration of Michael Gershowitz, Sep. 26, 2023, 77 pages.
*Samsung Electronics Co., Ltd. and Samsung Electronics America, Inc. v Manufacturing Resources International, Inc.*, Expert Declaration of Dr. Himanshu Pokhama,, Sep. 26, 2023, 104 pages.
*Samsung Electronics Co., Ltd. and Samsung Electronics America, Inc. v Manufacturing Resources International, Inc.*, Decision to Institute IPR2023-00199, Jun. 20, 2023, 53 pages.
*Samsung Electronics Co., Ltd. and Samsung Electronics America, Inc. v Manufacturing Resources International, Inc.*, Decision to Institute IPR2023-00220, Jun. 20, 2023, 51 pages.
*Samsung Electronics Co., Ltd. and Samsung Electronics America, Inc. v Manufacturing Resources International, Inc.*, Decision to Institute IPR2023-00221, Jun. 20, 2023, 80 pages.
*Samsung Electronics Co., Ltd. and Samsung Electronics America, Inc. v Manufacturing Resources International, Inc.*, Decision to Institute IPR2023-00254, Jun. 20, 2023, 72 pages.
*Samsung Electronics Co., Ltd. and Samsung Electronics America, Inc. v Manufacturing Resources International, Inc.*, Decision to Institute IPR2023-00255, Jul. 18, 2023, 47 pages.
*Samsung Electronics Co., Ltd. and Samsung Electronics America, Inc. v Manufacturing Resources International, Inc.*, Final Written Decision IPR2023-00199, Jul. 3, 2024, 78 pages.
*Samsung Electronics Co., Ltd. and Samsung Electronics America, Inc. v Manufacturing Resources International, Inc.*, Final Written Decision IPR2023-00220, Jul. 3, 2024, 78 pages.
*Samsung Electronics Co., Ltd. and Samsung Electronics America, Inc. v Manufacturing Resources International, Inc.*, Final Written Decision IPR2023-00254, Jul. 3, 2024, 114 pages.
*Samsung Electronics Co., Ltd. and Samsung Electronics America, Inc. v Manufacturing Resources International, Inc.*, Final Written Decision IPR2023-00221, Jul. 3, 2024, 116 pages.
*Samsung Electronics Co., Ltd. and Samsung Electronics America, Inc. v Manufacturing Resources International, Inc.*, Final Written Decision IPR2023-00255, Jul. 30, 2024, 94 pages.
ITSEnclosures, Product Catalog, 2009, 48 pages.
ITSEnclosures, Standard Product Data Sheet, 2011, 18 pages.
SunbriteTV, All Weather Outdoor LCD Television Model 4610HD, 2008, 1 page.
SunbriteTV, Introduces Two New All-Weather Outdoor Televisions InfoComm 2008, 7 pages.
ITSEnclosures, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMC analysis of an 18" LCD monitor, 2000, 1 page.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017,14 pages.
ADNation, Turn Key Advertising Technology Solutions, May 23, 2017, 4 pages.
CIVIQ Smartscapes, FlexVue Ferro 55P/55L, Mar. 16, 2017, 4 pages.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
CIVIQ, Invalidity Claim Charts, Appendix A—Appendix D, Jan. 24, 2018, 51 pages.
CIVIQ, Invalidity Contentions, Jan. 24, 2018, 51 pages.
Scott, Cooling of Electronic Equipment, Apr. 4, 1974, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
CIVIQ, Invalidity Claim Chart, Appendix I, Mar. 22, 2018, 4 pages.
CIVIQ, Invalidity Claim Charts, Appendix F to H, Mar. 22, 2018, 18 pages.
Yung, Using Metal Core Printed Circuit Board as a Solution for Thermal Management article, 2007, 5 pages.
*CIVIQ Smartscapes, LLC V. Manufacturing Resources International, Inc.*, Memorandum Opinion re claim construction, Sep. 27, 2018, 16 pages.
*CIVIQ Smartscapes, LLC V. Manufacturing Resources International, Inc.*, Claim Construction Order, Oct. 3, 2018, 2 pages.
Anandan, Munismay, Progress of LED backlights for LCDs, Journal of the SID, 2008, pp. 287-310, 16/2.
Melford Technologies, Part 2, video online at https://m.youtube.com/watch?v=znlyHWozwDA, Oct. 21, 2019, 1 page.

\* cited by examiner

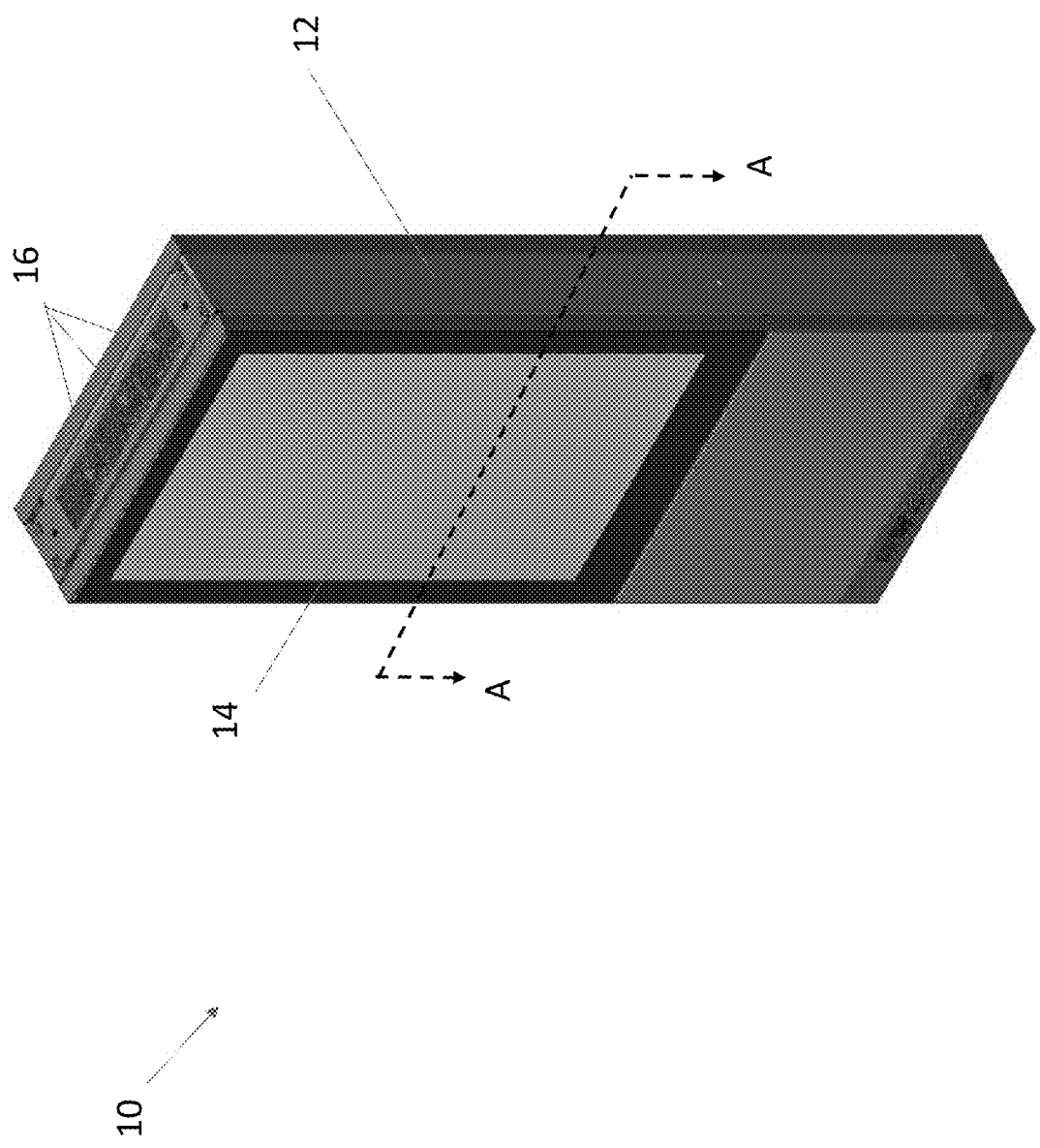

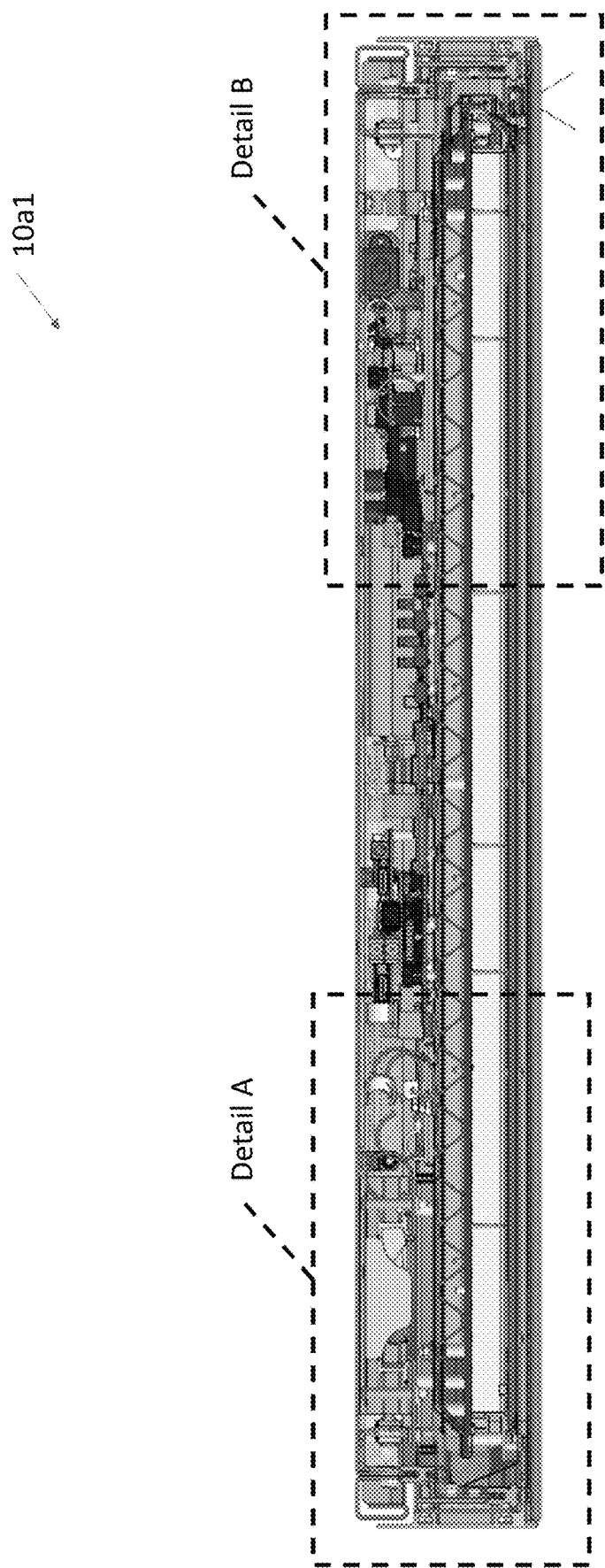
Figure 3A1

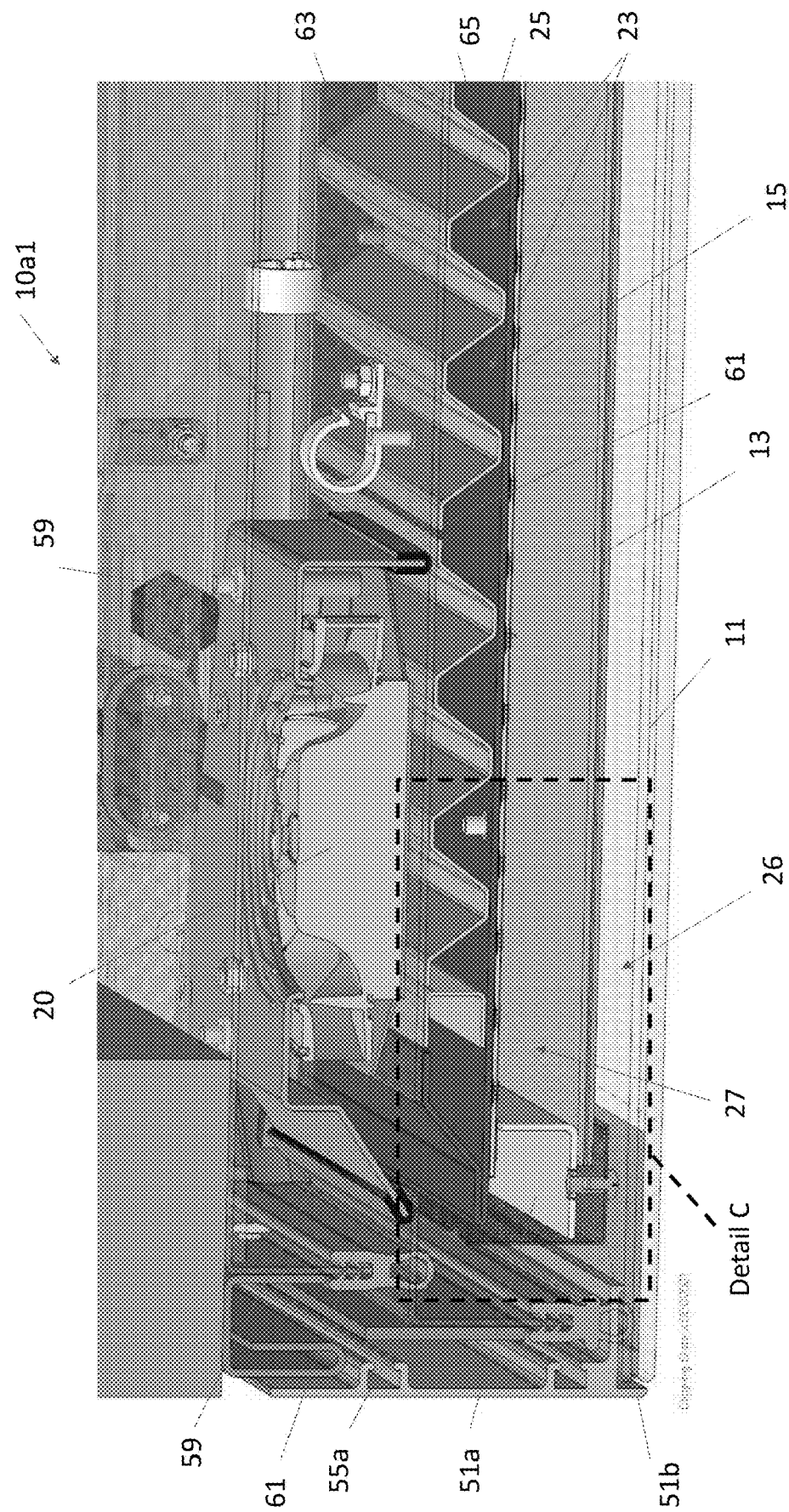
Figure 3A2

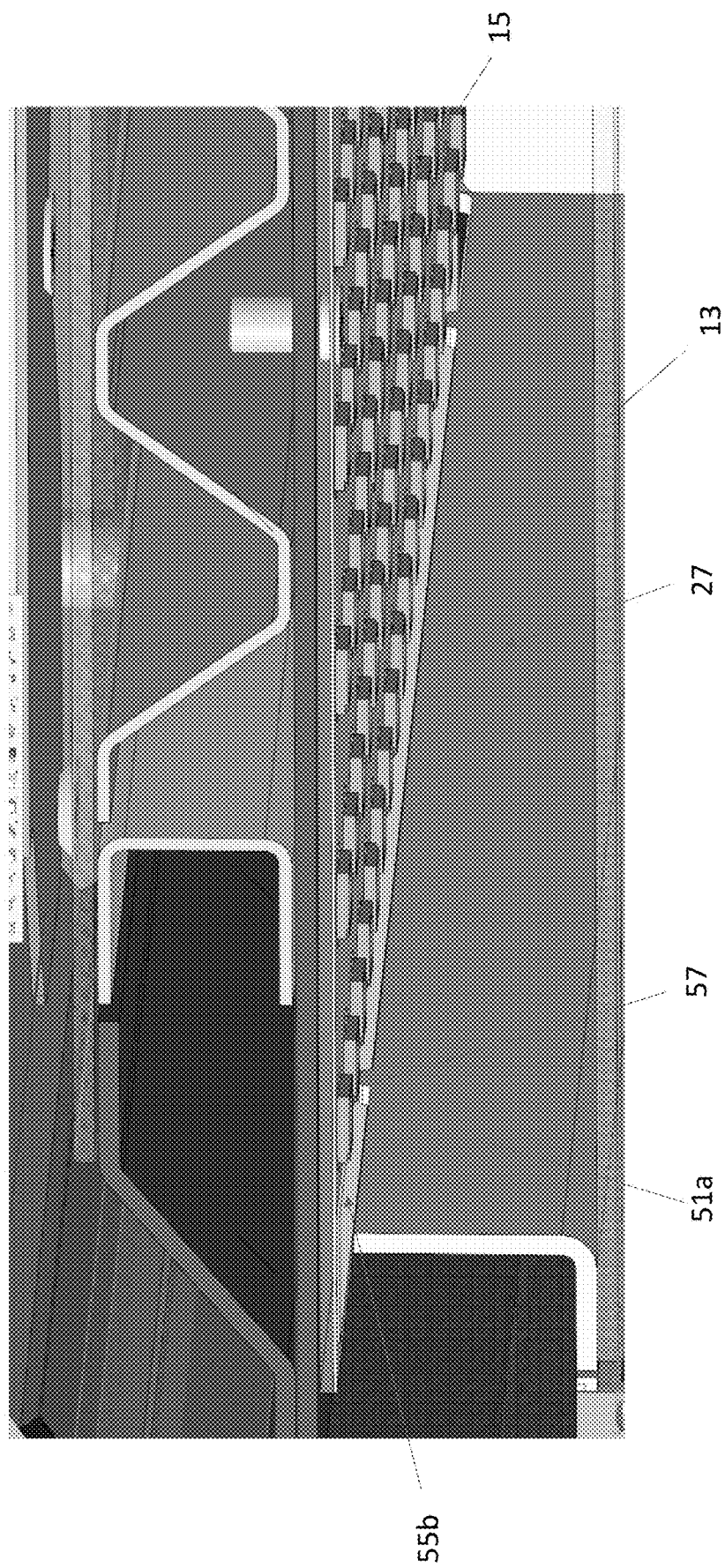
Figure 3A3

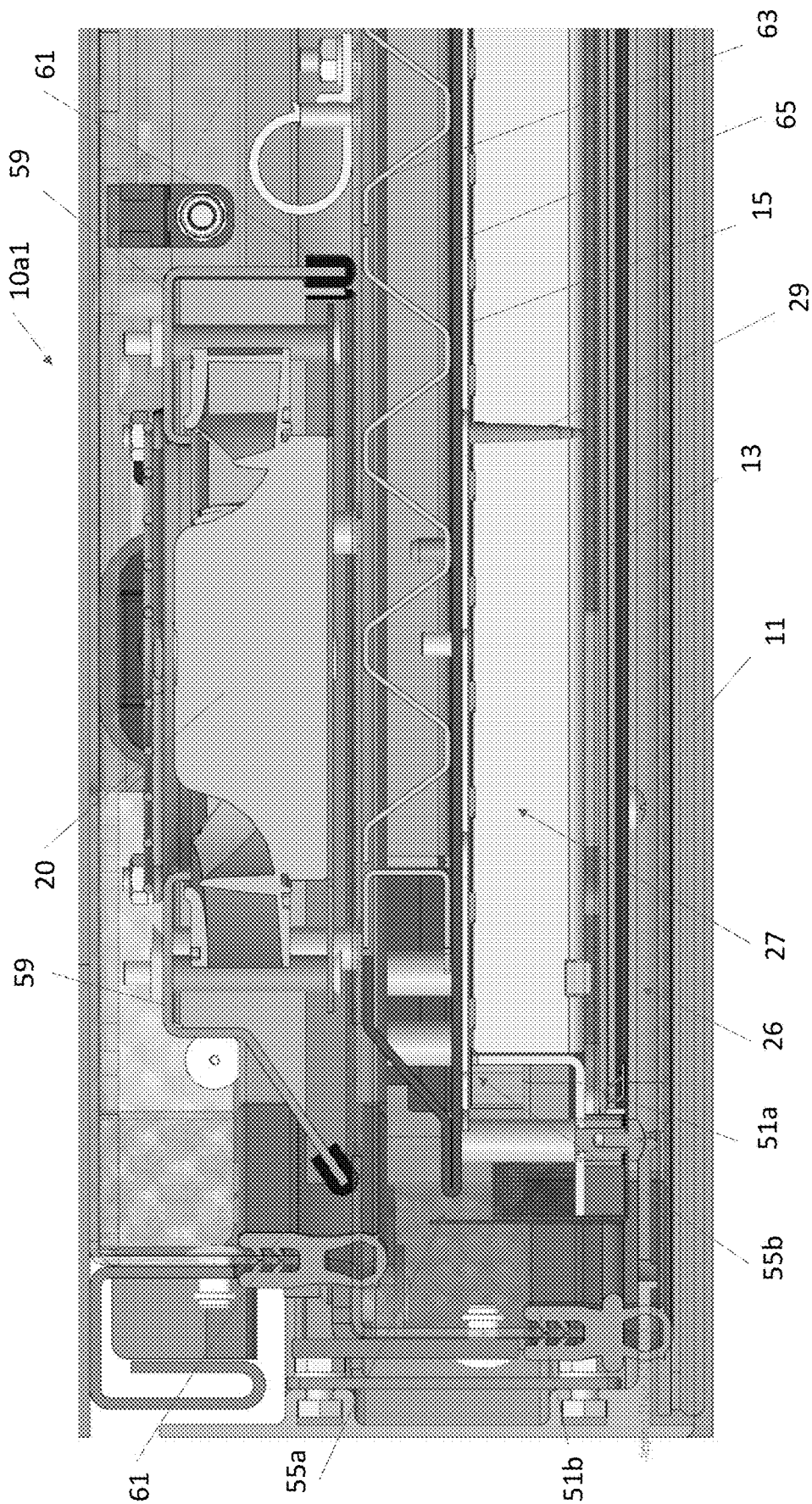
Figure 3A4

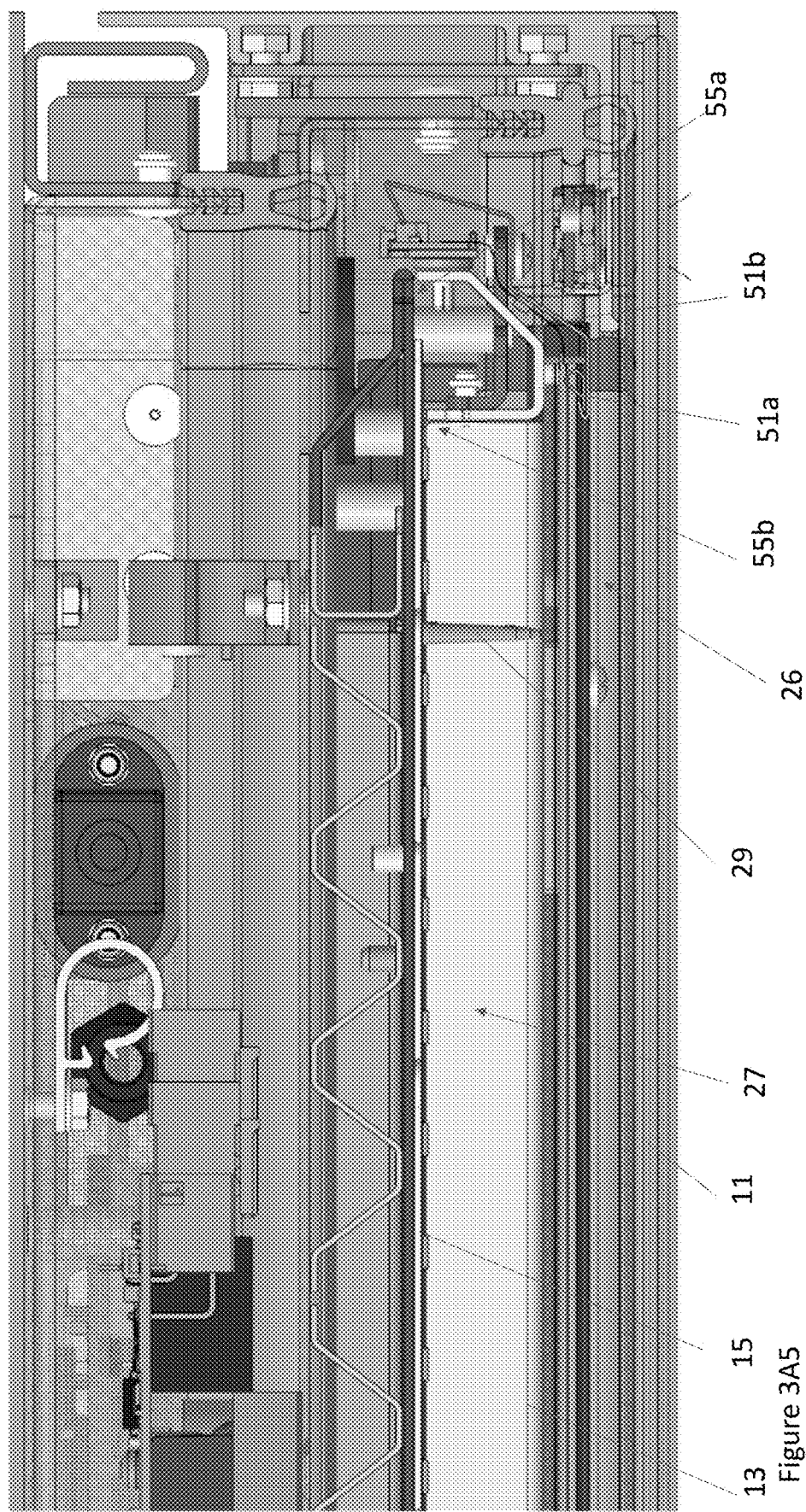
Figure 3A5

DISPLAY ASSEMBLIES FOR PROVIDING COMPRESSIVE FORCES AT ELECTRONIC DISPLAY LAYERS

CROSS-REFERENCE TO RELATED APPLICATIONS

This application is a continuation of U.S. application Ser. No. 18/609,896 filed Mar. 19, 2024, which is a continuation of U.S. application Ser. No. 17/387,438 filed Jul. 28, 2021, now U.S. Pat. No. 11,966,263 issued Apr. 23, 2024, the disclosures of which are incorporated by reference as if fully restated herein.

TECHNICAL FIELD

Exemplary embodiments relate generally to display assemblies configured to provide compressive forces at on one or more electronic display layers, such as on one or both sides of electronic display layers.

BACKGROUND AND SUMMARY OF THE INVENTION

Certain electronic display layers, such as those comprising liquid crystals, are relatively thin. These electronic display layers often span a relatively large area. In some cases, these electronic display layers may only be supported at a perimeter. This may subject the electronic display layers to distortion by external forces, such as air pressure. Such distortions may result in various optical or other performance issues. These issues become particularly problematic when relatively large displays are utilized because relatively small air pressures experienced over a large area result in application of significant net forces. It is known to provide air on either side of an electronic display layer to create a pressure differential which reduces or eliminates bowing of the electronic display layer, such as is shown and/or described in U.S. Pat. No. 10,398,066 issued Aug. 27, 2019.

It is known to provide various optical layers at the electronics display layer and/or a cover for the same including, but not limited to, polarizing films, anti-reflective coatings, combinations thereof, or the like to improve optical qualities of displayed images. In certain cases, it may be desirable to provide compressive forces on one or both sides of an electronic display layer to prevent or eliminate cell breach of the electronic display layer and/or mechanical separation of optical layers. What is needed is a display assembly which provides compressive forces on one or both sides of an electronic display layer.

Display assemblies which provide compressive forces on one or both sides of an electronic display layer, and methods related to the same, are provided. The display assemblies may include one or more closed loop airflow pathways. At least one of the closed loop airflow pathways may include a front passageway which extends between a cover for the electronic display layer and the electronic display layer itself as well as an illumination device passageway which extends between the electronic display layer and an illumination device for the electronic display layer. A rear passageway extending behind the illumination device may be in fluid communication with both the front passageway and the illumination device passageway to complete the closed loop airflow pathway, which may encircle the illumination device and/or the electronic display layer.

A closed loop fan unit may be positioned adjacent to an entrance to the front passageway and the illumination device passageway in exemplary embodiments. The closed loop fan unit may be configured to push circulating gas through the front passageway and illumination device passageway when activated. The closed loop fan unit may be configured to generate a relatively high-pressure area at a first side of the closed loop fan unit facing the entrance to the front passageway and illumination device passageway such that such a relatively high-pressure flow is created within at least a portion of the front passageway and illumination device passageway when activated. The closed loop fan unit may be configured to generate a relatively low-pressure area at an opposing side of the closed loop fan unit facing the rear passageway when activated such that a relatively low-pressure flow is created within the rear passageway when activated. When operated, the closed loop fan unit may be configured to generate a pressure differential on one or both sides of the electronic display layer such that a pressure of a flow of the circulating gas in the front passageway is higher than a pressure of a flow of the circulating gas in the illumination device passageway. This may result in inward directed net forces at the electronic display layer which forces the electronic display layer rearward towards the illumination device, thereby reducing or eliminating bowing of the electronic display layer. This arrangement may be configured to create a positive pressure relative to ambient at one or both of a front and/or rear surface of the electronic display layer (e.g., in the front passageway and/or the illumination device passageway) so as to provide compressive forces at the front and/or rear side of the electronic display layer. This may prevent cell breach in the electronic display layer and/or mechanical separation of the optical layers from either or both of the electronic display layer and the cover. Optical spikes may be provided between the electronic display layer and the illumination device, such as within the illumination device passageway, to limit or prevent rearward movement of the electronic display layer towards the illumination device to prevent visual distortions.

In other exemplary embodiments, the closed loop fan unit may be positioned at an exit of the front passageway and illumination device passageway. The closed loop fan unit, in such embodiments, may be configured to draw circulating gas through the front passageway and the illumination device passageway. The closed loop fan unit, in such embodiments, may be configured to generate a relatively low-pressure area at the exit to the front passageway and the illumination device passageway and/or a relatively high-pressure area at an opposing side of the closed loop fan unit oriented towards the rear passageway when activated. In such embodiments, the closed loop fan unit may be configured to create a negative pressure relative to ambient within some or all of the front passageway and/or illumination device passageway such that a pressure of a flow of the circulating gas in the front passageway is higher than a pressure of a flow of the circulating gas in the illumination device passageway, even if one or both are negative relative to pressure of ambient air. Such an arrangement may permit creation of differential pressures sufficient to reduce or eliminate bowing of the electronic display layer.

The display assemblies may include multiple electronic display layers in exemplary embodiments. Where multiple electronic display layers are utilized, a single rear passageway may be common to at least two of the multiple electronic display layers. The display assemblies may include one or more open loop airflow pathways for ambient air. One or more open loop fan units may be provided for forcing ambient air through the open loop airflow pathways when operated. A structural framework may be used to secure and/or house the various components of the display assemblies. The closed loop fan units may be mounted within the rear passageways, in exemplary embodiments. Electronic components for operating the electronic display layers may be provided within the rear passageway.

Pressure sensors may be provided to monitor the differential pressure created, pressures of circulating gas within one or both of the front passageway and illumination device passageway and/or pressures of ambient air. Such sensors may be in electronic communication with one or more controllers. Operation of the closed loop fan units and/or open loop fan units may be adjusted, such as by the controllers, in response to readings from the sensors. For example, speed or duration of operation of the closed loop fan units may be adjusted to maintain the desired pressure differential and/or positive pressure relative to ambient within one or both of the front passageway and/or illumination device passageway.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein:

FIG. 1 is a perspective view of an exemplary display assembly indicating section lines A-A;

FIG. 3A1 is a top sectional view of the display assembly of FIG. 3A;

FIG. 3A2 is a detailed perspective view of detail A of FIG. 3A1;

FIG. 3A3 is a detailed perspective view of detail C of FIG. 3A2;

FIG. 3A4 is a detailed top sectional view of detail A of FIG. 3A1;

FIG. 3A5 is a detailed top sectional view of detail B of FIG. 3A1;

DETAILED DESCRIPTION OF EXEMPLARY EMBODIMENT(S)

Figure 2A:
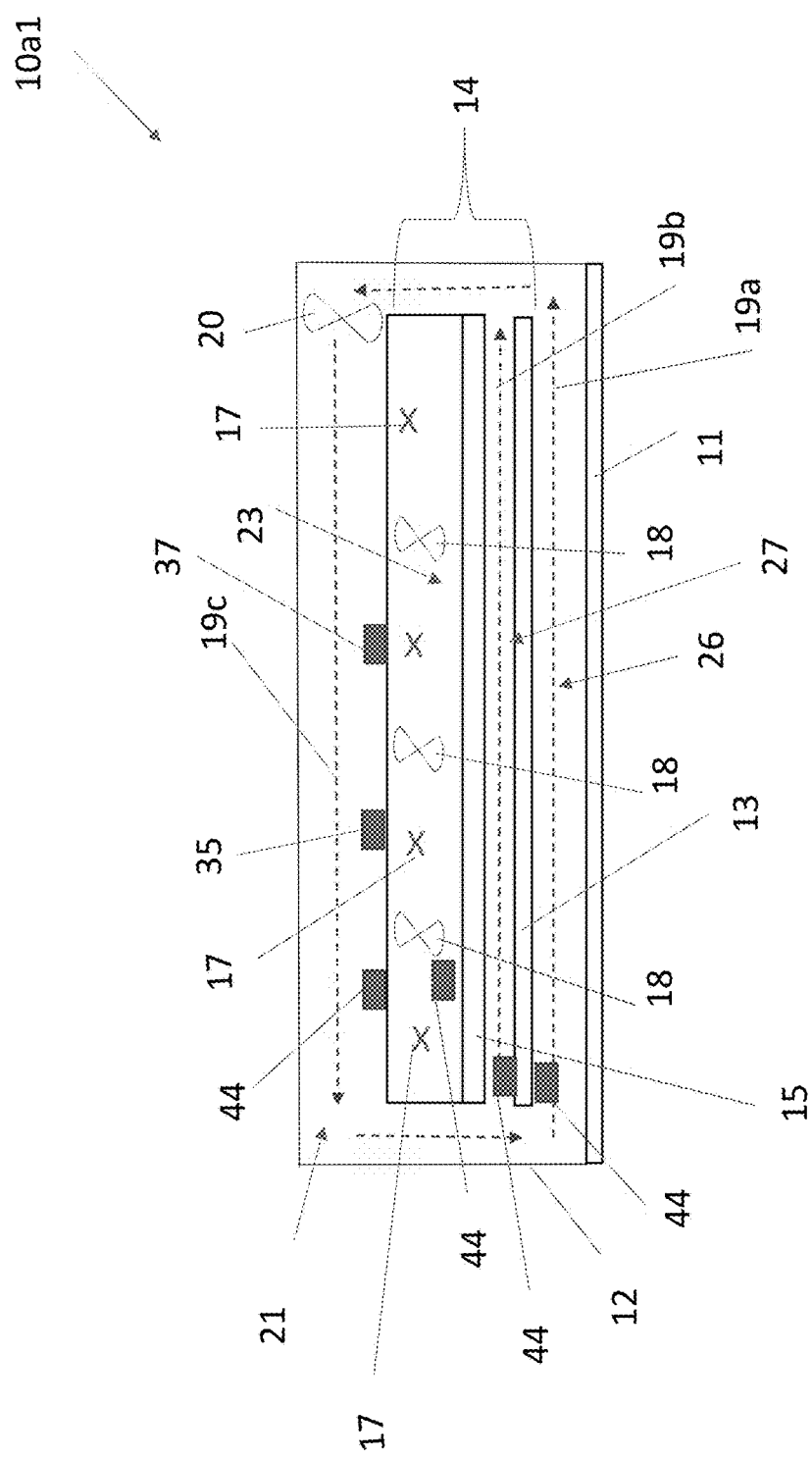
FIG. 2A is a top sectional view of an exemplary embodiment of the display assembly of FIG. 1 taken along section line A-A.
Figure 2B:
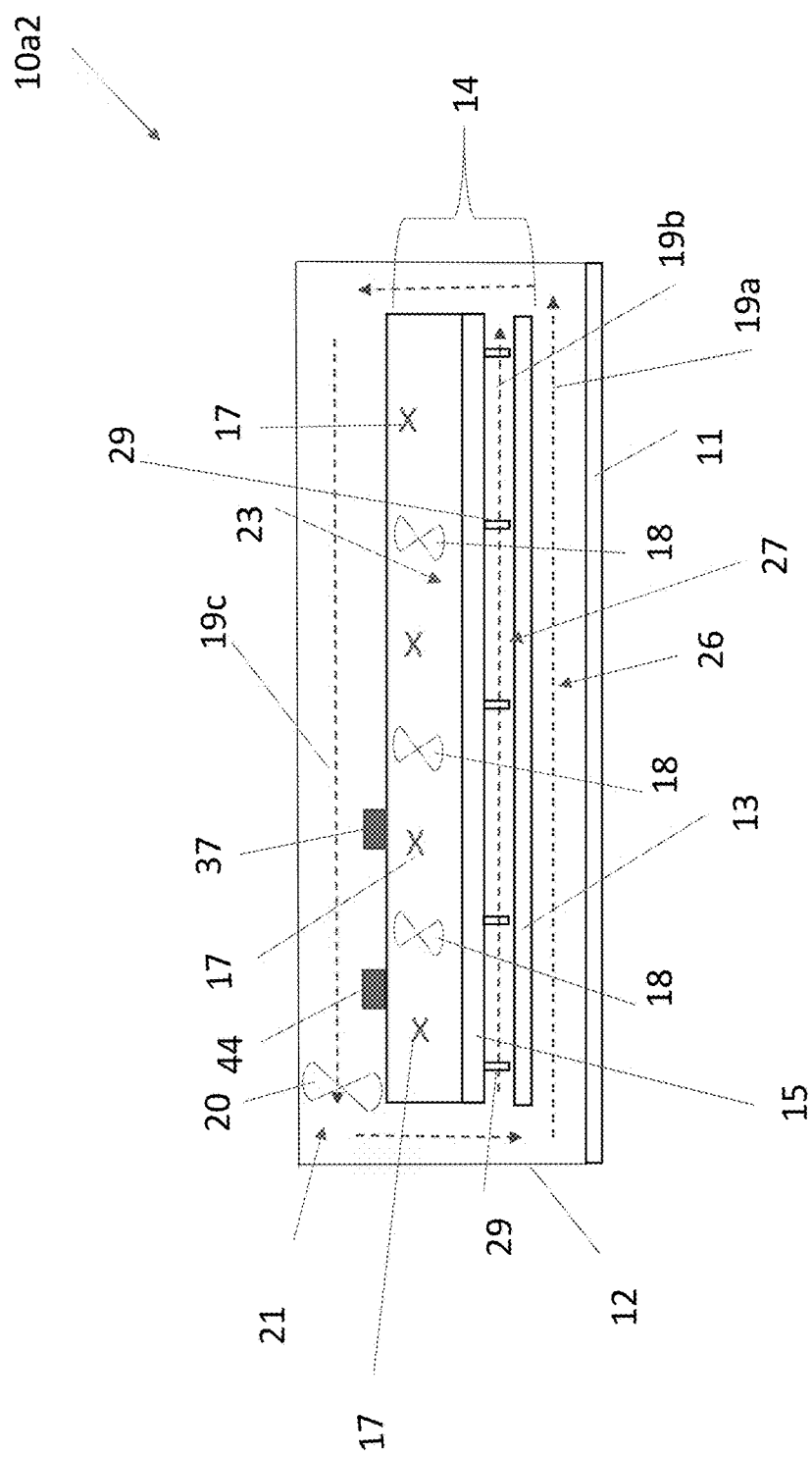
FIG. 2B is a top sectional view of another exemplary embodiment of the display assembly of FIG. 1 taken along section line A-A.

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

FIG. 1 is a perspective view of an exemplary electronic display assembly (hereinafter also a "unit") 10 in accordance with the present invention. The unit 10 may include a structural framework 12. The structural framework 12 may be configured for mounting to a ground surface, such as a sidewalk or street, mounting to a wall or other surface, incorporation into street furniture (e.g., phone booths, bus shelters, benches, railings, combinations thereof, or the like), combinations thereof, or the like. The structural framework 12 may comprise one or more members, panels, cladding, panels, housings, combinations thereof, or the like.

The units 10 may comprise one or more electronic display subassemblies 14. Some or all of the electronic display subassemblies 14 may be attached to the structural framework 12 in a moveable manner, though such is not required. For example, the electronic display subassemblies 14 may be attached to the structural framework in a hinged manner to permit selective movement between a closed position whereby certain parts of the units 10 are fully or partially sealed, and an open position whereby certain parts of the interior of the unit 10 are exposed for access.

One or more intakes and exhausts 16 may be provided at the units 10 for ingesting and exhausting ambient air.

Figure 3A:
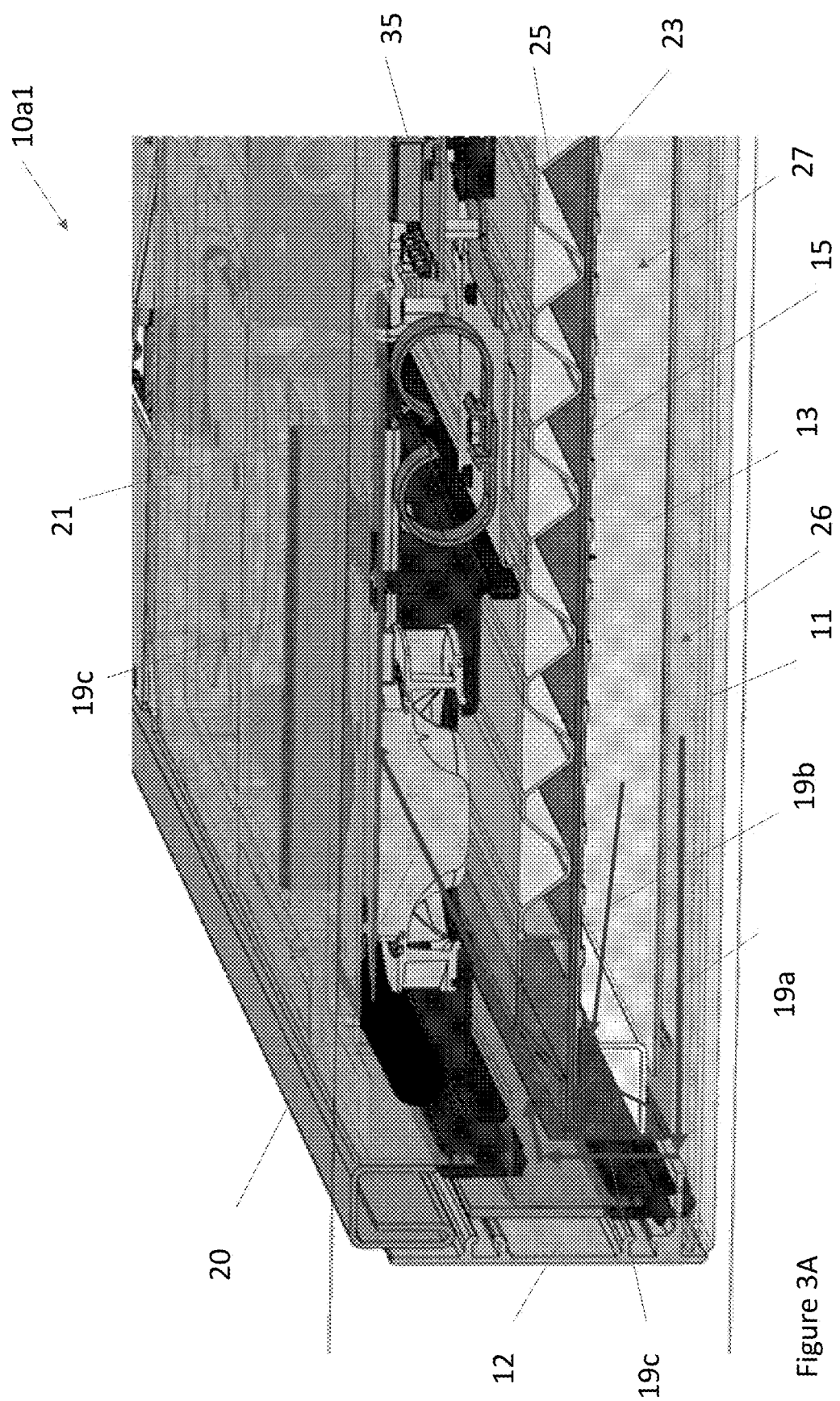
FIG. 3A is a perspective sectional view of an exemplary embodiment of the display assembly of FIG. 1 taken along section line A-A.
Figure 3B:
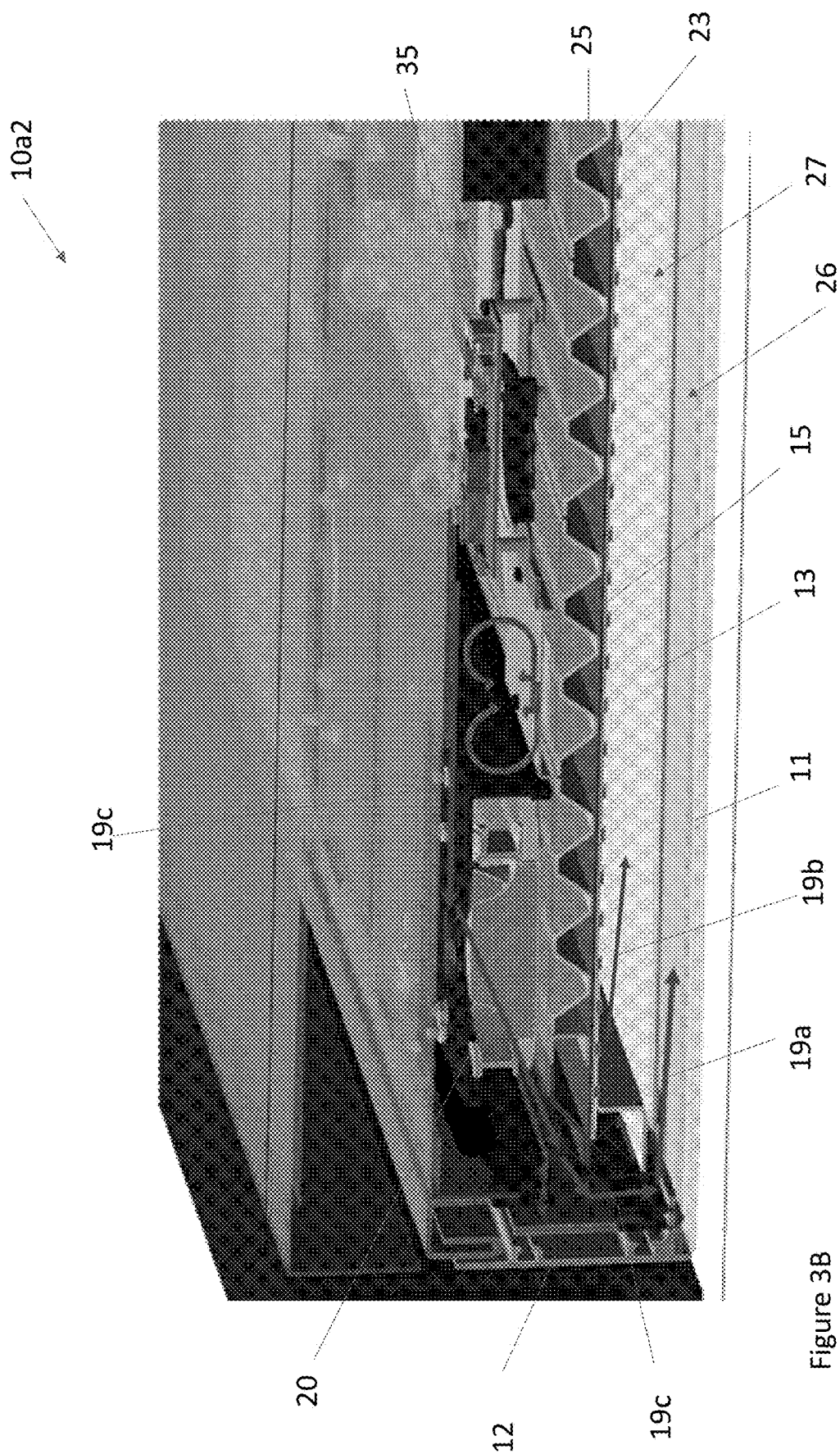
FIG. 3B is a perspective sectional view of another exemplary embodiment of the display assembly of FIG. 1 taken along section line A-A.
Figure 4A:
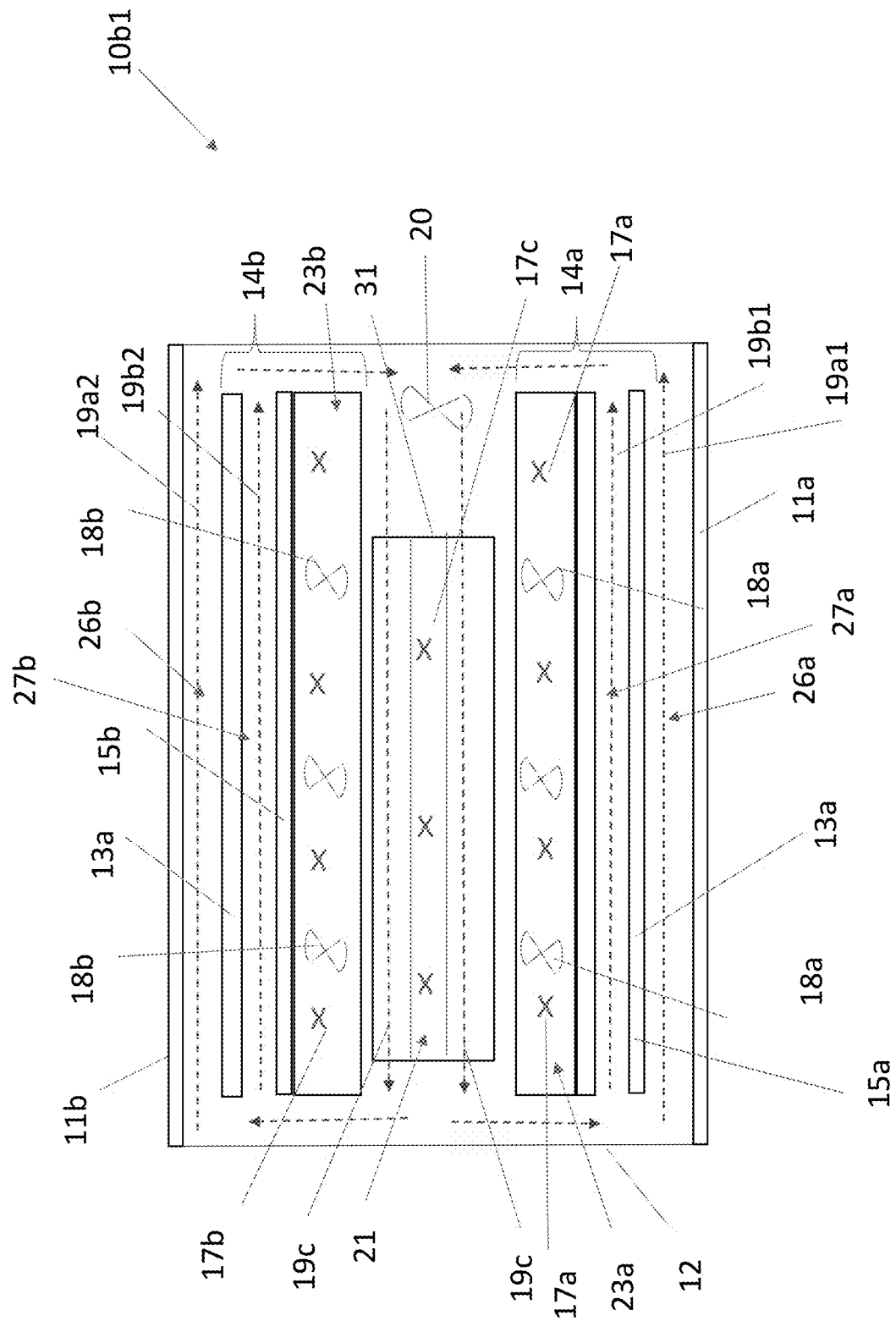
FIG. 4A is a top sectional view of the display assembly of another exemplary embodiment of the display assembly of FIG. 1 taken along section line A-A.
Figure 4B:
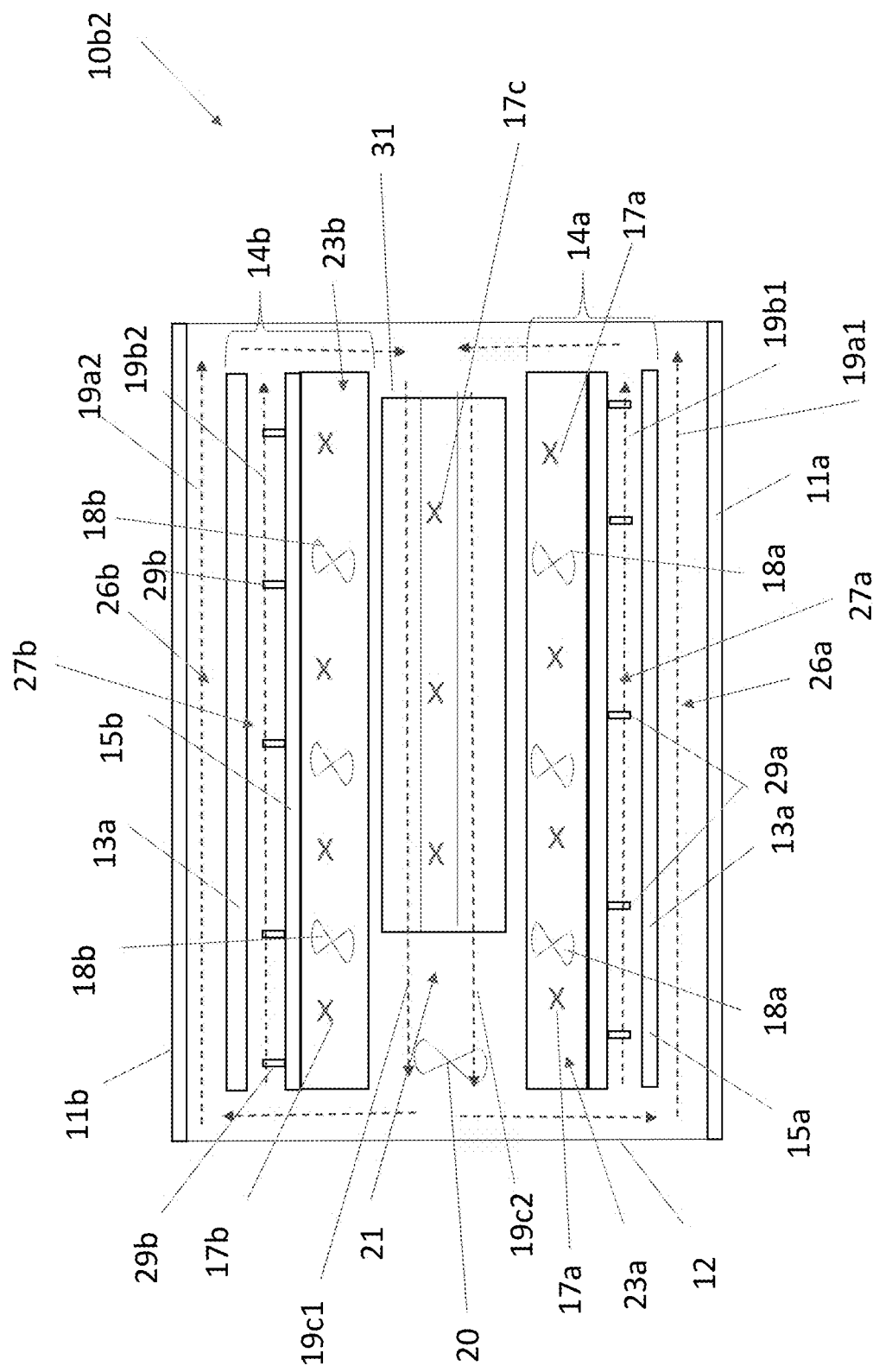
FIG. 4B is a top sectional view of the display assembly of another exemplary embodiment of the display assembly of FIG. 1 taken along section line A-A.

FIG. 2A through FIG. 4B illustrate various exemplary embodiments of airflow pathways within the units 10. FIGS. 2A-3B illustrate exemplary units 10a1, 10a2 with a single electronic display subassembly 14. FIGS. 4A-4B illustrate exemplary units 10b1, 10b2 with two electronic display subassemblies 14a, 14b placed in a back-to-back arrangement. Any number of electronic display subassemblies 14 may be utilized in any arrangement with the structural framework 12. Similar or the same components used in conjunction with units 10 having multiple electronic display subassemblies 14 may use the same numbering with the addition of an "a", "b" and/or "1", "2", etc. (e.g., 14 to 14a, 14b, 19a to 19a1, 19a2). Any features or arrangements shown and/or described with respect to any of the embodiments of the units 10a1, 10a2, 10b1, 10b2 (sometimes referred to collectively as "unit 10" or "units 10" herein) may be used with any other embodiment of the units 10.

Each electronic display subassembly 14 may comprise an illumination device 15. In exemplary embodiments, the illumination device 15 may comprise a number of lighting elements, such as LEDs, provided at a substrate, such as a printed circuit board. Each electronic display subassembly 14 may comprise an electronic display layer 13. The electronic display layer 13 may comprise a layer of liquid crystals, such as for a liquid crystal display, though any type or kind of electronic display may be utilized. In exemplary embodiments, the illumination device 15 may be provided rearward of the electronic display layer 13 to serve as a direct backlight. In other exemplary embodiments, the illumination device 15 may comprise one or more diffusive and/or transmissive layers and the substrate and/or lighting elements may be positioned about the edge of the electronic display layer 13 to provide edge lighting to the same.

The electronic display layer 13 and/or illumination device 15 may be positioned rearward of a cover 11. The cover 11 may comprise one or more layers of a transparent or translucent material(s). In exemplary embodiments, each cover 11 may comprise two layers bonded with an optically clear adhesive, which may provide increased impact protection. One or more polarizers, anti-reflective materials, combinations thereof, or the like may be disposed on some or all of the cover 11 as a coating, film, layer, combinations thereof, or the like. The cover 11 may form part of the electronic display subassembly 14 or may be separate therefrom. The cover 11 and the structural framework 12 may together substantially enclose the units 10, such as with intakes/exhausts 16 exempted, when the subassemblies 14 are placed in a closed position. The cover 11 may be configured to move with the electronic display subassembly 14, may be configured for independent movement, and/or may be fixed to the structural framework 12. Each of the electronic display subassemblies 14 may be connected to the structural framework 12 in a hinged or otherwise movable manner, though such is not required.

A single or multiple such electronic display subassemblies 14 may be provided at a single unit 10, such as, but not limited to, in a back-to-back arrangement. The electronic display subassemblies 14 may be of the same or different type and may comprise the same or different components. The electronic display subassemblies 14 may be provided in any arrangement such as portrait or landscape.

The intakes and/or exhausts 16 may be fluidly connected to one or more open loop airflow pathways 23 within the units 10. A respective one of the open loop airflow pathways 23a, 23b may extend through a respective one of the electronic display subassemblies 14a, 14b in exemplary embodiments such that an open loop airflow pathway 34 is provided for each one of the electronic display subassemblies 14, which may be entirely separate, or separated for a distance and rejoined. For example, without limitation, the open loop airflow pathways 23 may extend behind and along at least a portion of the illumination devices 15 for the electronic display layer 13 for accepting flows 17a, 17b of ambient air. The open loop airflow pathways 23 may comprise one or more corrugated layers 25 in exemplary embodiments.

One or more closed loop airflow pathways may be provided within the units 10. In exemplary embodiments, such closed loop airflow pathways may comprise at least a front passageway 26, which may extend between the cover 11 and the electronic display layer 13. Such closed loop airflow pathways may comprise a rear passageway 21, which may extend behind the electronic display subassembly 14, and/or behind the electronic display layer 13. Such closed loop airflow pathways may extend entirely within the unit 10, such as within outer boundaries of the structural framework 12. Where multiple electronic display subassemblies 14a, 14b are utilized, the rear passageway 21 may be common to at least two of the electronic display subassemblies 14a, 14b, though such is not required. A heat exchanger 31 may be located within the rear passageway 21, though such is not required. The heat exchanger 31 may comprise a multilayer heat exchanger configured to accommodate a common flow 19c of the circulating gas through at least some of the layers as well as one or more flows 17c of ambient air through at least some other ones of the layers.

Various electronic components 35 for operating the unit 10 may be provided within the rear passageway 21. The electronic components 35 may include, for example, without limitation, video players, power supplies, processors, electronic storage devices, controllers 37, sensors 44, combinations thereof, or the like. Any number, type, and/or kind of components 35 may be utilized.

An illumination device passageway 27a, 27b may extend between each of the electronic display layers 13a, 13b and the respective illumination devices 15a, 15b. A flow of circulating gas 19c within the rear passageway 21 may be separated such that a first portion 19a flows through the front passageway 26 and a second portion 19b flows through the illumination device passageway 27. The flows 19a, 19b may be recombined, such as in the rear passageway 21.

One or more open loop fan units 18 may be provided. The same of different open loop fan units 18 may be associated with each of the open loop airflow pathways 23. The open loop fan units 18 may be configured to ingest ambient air 17 into the units 10, exhaust ambient air 17 from the assembly 10, and/or move ingested ambient air 17 through the one or more open loop airflow pathways 23 when activated. Multiple open loop fan units 18a, 18b may be used where multiple electronic display subassemblies 14a, 14b are utilized, for example, or such open loop fan units 18 may be common to multiple ones of the electronic display subassemblies 14 of such units 10.

One or more closed loop fan units 20 may be provided. Each closed loop fan unit 20 may comprise one or more fans or the same of different type. The same or different closed loop fan units 20 may be associated with each of the closed loop airflow pathways. The closed loop fan units 20 may be configured to move circulating gas through said one or more closed loop airflow pathways when activated. The closed and open loop fan units 20, 18 may comprise axial fans, centrifugal fans, combinations thereof, or the like. Any number or type of fan units 20, 18 may be used at any location in the units 10, and may be provided in banks or sets. The open loop airflow pathways 23 may be separate from the closed loop airflow pathways, though a complete (e.g., gas impermeable) separation is not necessarily required. The same closed loop fan units 20 may be used to move circulating gas through the front passageways 26a, 26b and/or illumination device passageways 27a, 27b of multiple electronic display subassemblies 14a, 14b where such multiple electronic display subassemblies 14a, 14b are provided for a unit 10, though such is not required.

The unit 10 may comprise a controller 37 and/or one or more sensors 44. The sensors 44 may comprise, for example, without limitation, temperature sensors, fan speed sensors, airflow sensors, humidity sensors, relative humidity sensors, air pressure sensors, differential pressure sensors, location sensors, moisture sensors, combinations thereof, or the like. Any type, kind, or number of sensors 44 may be utilized at any number of locations within the units 10. In exemplary embodiments, at least certain of the sensors 44 may comprise tubes or other fluid passageways to connect the sensor(s) 44 to other parts of the units 10 and/or the ambient environment. This may provide for flexibility in placement and design. Any type, kind, or number of controllers 31 may be utilized at any number of locations within the units 10. Such sensors 44 and/or controller 37 are not necessarily required, and may be omitted from view of certain embodiments provided herein to more clearly illustrate other components. However, such sensors 44 and/or controller 37 may be utilized in the same or similar arrangements in such embodiments, even where not expressly provided in the figures.

The one or more closed loop fan units 20 may be configured to create a pressure differential. For example, an intake side of each closed loop fan unit 20 may be configured to generate a relatively low-pressure area or flow and an exhaust side may be configured to generate a relatively high-pressure area or flow. As illustrated with particular regard to FIGS. 2A, 3A-3A5, and 4A, in exemplary embodiments, one or more of the closed loop fan units 20 may be positioned adjacent to an exhaust for the front passageway 26 and/or the illumination device passageway 27. For example, without limitation, the closed loop fan units 20 in such embodiments may be positioned at a portion of the rear passageway 21 adjacent to an exit from one or both of the front passageway 26 and the illumination device passageway 27 for generating the flows 19a and/or 19b within the front passageway 26 and the illumination device passageway 27 by pulling the circulating gas into an intake side of the closed loop fan unit 20, and generating the flow 19c within the rear passageway 21 by pushing the circulating gas out an exhaust side of the closed loop fan unit 20. Because the intake, relatively low-pressure side, of the closed loop fan units 20 is fluidly adjacent to the front passageway 26 and/or the illumination device passageway 27, the pressure of the flows 19a and/or 19b, particularly near the exit of the front passageway 26 and/or the illumination device passageway 27, may be maintained at a relatively low level, such as negative relative to pressure of ambient air outside of the units 10, though such is not necessarily required.

Alternatively, without limitation, the one or more of the closed loop fan units 20 may be positioned at a portion of the rear passageway 21 adjacent to an entrance into one or both of the front passageway 26 and the illumination device passageway 27 for generating the flows 19a and/or 19b through the front passageway 26 and the illumination device passageway 27 by pushing the circulating gas through the front passageway 26 and the illumination device passageway 27. Because the exhaust, relatively high-pressure side of the closed loop fan units 20 is fluidly adjacent to the front passageway 26 and/or the illumination device passageway 27, the pressure of the flows 19a and/or 19b, particularly at the entrances to the front passageway 26 and the illumination device passageway 27, may be maintained at a relatively high level, such as greater than pressure of ambient air outside of the units 10, though such is not necessarily required.

The front passageway 26 and/or the rear passageway 21 may be configured to create and maintain a pressure differential between the flows 19a and 19b of the circulating gas in the front passageway 26 and/or the rear passageway 21 sufficient to generate net forces at the electronic display layers 13 which reduces or eliminates bowing of the electronic display layers 13. In exemplary embodiments, the pressure of the flow 19a in the front passageway 26 may be maintained at a higher level than the flow 19b in the illumination device passageway 27, resulting in rearward forces against the electronic display layer 13 to reduce or eliminate outward bowing. Such pressure differentials may be generated using features including, but not limited to, those shown and/or described in U.S. Pat. No. 10,398,066 issued Aug. 27, 2019, the disclosures of which are hereby incorporated by reference as if fully restated herein.

In exemplary embodiments, without limitation, one or more intake openings 53a, 53b into the illumination device passageway 27 from the rear passageway 21 may be larger than one or more exit openings 55a, 55b from the illumination device passageway 27 to the rear passageway 21. In this manner, more circulating gas may be ingested into the illumination device passageway 27 than is readily able to exit, thereby raising average pressure in the illumination device passageway 27.

As shown with particular regard to FIGS. 3A1-3A5, the electronic display layer 13 may be held in place by one or more brackets 51a, 51b. The brackets 51 may define, at least in part, the one or more intake openings 53a, 53b and/or the one or more exit openings 55a, 55b. At least some of the brackets 51 may comprise protrusions 57 configured to maintain relatively spacing for the intake openings 53 and/or the exit openings 55.

One or more of the closed loop fan units 20 may be provided wholly or partially within one or more housings 59. The housings 59 may be configured to direct circulating gas in an appropriate direction, such as between the front passageway 26 and/or the illumination device passageway 27 into the rear passageway 21, or vice versa.

One or more gaskets 61 may be provided at the housing 59. For example, without limitation, the gaskets 61 may be provided to fully or partially seal the housings 59 against a panel 63. In this fashion, the closed loop fan units 20 may be fully or partially sealed against the panel 63 so as to increase the amount of air forced into the front passageway 26 and/or the illumination device passageway 27, such as from the rear passageway 21, and/or out of the front passageway 26 and/or the illumination device passageway 27, such as from the rear passageway 21. The gaskets 61 may, alternatively or additionally, provide vibrational damping and/or sound reduction, such as during operation of the closed loop fan units 20. The gaskets 61 may comprise rubber and/or a rubber composite, by way of non-limiting example.

The panel 63 may form part of the open loop airflow pathway 23. For example, without limitation, the panel 63 and an additional panel 65 may be provided spaced apart from one another, such as with the corrugated layer 25 therebetween, to at least partially define the open loop airflow pathway 23.

In exemplary embodiments, positive pressure may be maintained in only the front passageway 26 and/or relatively high pressure may be maintained in the front passageway 26 (e.g., relative to pressure in the flow 19b in the illumination device passageway 27) such that the electronic display layer 13 is pushed towards the illumination device 15 when the closed loop fan unit 20 is operated. Optical spikes 29 or other support structures may be utilized within the illumination device passageway 27 to reduce or eliminate movement of the electronic display layer 13 towards the illumination device 15, such as past the optical spikes 29. The optical spikes 29 may comprise one or more optically transmissible materials. The optical spikes 29 may comprise rods, cones, or the like positioned within the illumination device cavity 27 and may be configured to limit or prevent rearward travel of the electronic display layer 13. The optical spikes 29 may exert normal, compressive forces on the electronic display layer 13, particularly in conjunction with the pressure of the flow 19a of the circulating gas within the front passageway 26. This may be particularly beneficial when unable to generate positive or sufficiently high pressure for the flow 19b of the circulating gas within the illumination device passageway 27. This may occur, for example, without limitation, due to variations in ambient air and/or circulating gas pressure. Circulating gas pressure, in particular, may vary due to temperature variations in the circulating gas (e.g., due to solar loading) and/or ambient temperatures, which may affect the unit's 10 ability to remove heat in air-to-air heat exchange.

In exemplary embodiments, the pressure of the circulating gas in the front passageway 26 and the illumination device passageway 27 may be regularly, sporadically, and/or continuously monitored and operations may be adjusted based on such measurements. Such operations may include the speed or other operation of the closed loop fans 20. Such operations may be adjusted to desired pressures in the front passageway 26 and the illumination device passageway 27, such as positive pressures in one or both, and/or desired differential pressure between the same.

Any number, type, kind, and/or arrangement of such optical spikes 29 may be utilized. In embodiments where more than one electronic display layer 13a, 13b is utilized, more than one set of optical spikes 29a, 29b for each respective one of the electronic display layers 13a, 13b of the same or different type may likewise be utilized, though such is not required. Such optical spikes 29 are not necessarily required, and may be omitted from view of certain embodiments provided herein to more clearly illustrate other components. However, such optical spikes 29 may be utilized in the same or similar arrangements in such embodiments, even if not expressly provided in the figures.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

Certain operations described herein may be performed by one or more electronic devices. Each electronic device may comprise one or more processors, electronic storage devices, executable software instructions, and the like configured to perform the operations described herein. The electronic devices may be general purpose computers or specialized computing devices. The electronic devices may comprise personal computers, smartphone, tablets, databases, servers, or the like. The electronic connections and transmissions described herein may be accomplished by wired or wireless means. The computerized hardware, software, components, systems, steps, methods, and/or processes described herein may serve to improve the speed of the computerized hardware, software, systems, steps, methods, and/or processes described herein.

What is claimed is:

1. A display assembly for preventing delamination of an optical stack, said display assembly comprising:
    a first airflow passageway located, at least in part, forward of the optical stack;
    a second airflow passageway located, at least in part, rearward of the optical stack;
    a third airflow passageway located, at least in part, rearward of the second airflow passageway;
    a continuous, interconnected airflow pathway comprising each of the first, second, and third airflow passageways; and
    one or more fan units positioned along the continuous, interconnected airflow pathway, which when activated, move gas through the continuous, interconnected airflow pathway, including pushing said gas into the first and second airflow passageways.

2. The display assembly of claim 1 wherein:
    said one or more fan units, when activated, at least primarily pulls said gas through said third airflow passageway.

3. The display assembly of claim 1 wherein:
    the one or more fan units, when activated, are configured to generate compressive forces by the gas at the optical stack.

4. The display assembly of claim 1 wherein:
    at least one of the one or more fan units is positioned proximate to an entrance to each of the first and second airflow passageways.

5. The display assembly of claim 4 wherein:
    the third airflow passageway extends between the entrance to each of the first and second airflow passageways and an exit of each of the first and second airflow passageways.

6. The display assembly of claim 5 wherein:
    said one or more fan units, when activated, pushes said gas at a relatively high-pressure into the entrance to said first and second passageways and pulls said gas at a relatively low-pressure side from the exit of said third passageway.

7. The display assembly of claim 5 wherein:
    at least a majority of the first, second, and third airflow passageways extend in longitudinal alignment with one another.

8. The display assembly of claim 7 wherein:
    said one or more fan units, when activated, moves said gas through said first and second airflow passageways in a first, same primary direction and through said third airflow passageway in a second primary direction opposing the first direction.

9. The display assembly of claim 1 wherein:
    the optical stack comprises a liquid crystal layer.

10. The display assembly of claim 9 wherein:
    said optical stack comprises at least one of: a polarizer, and anti-reflective film, an optical enhancement film, a diffusive layer, and an optically transmissive layer.

11. The display assembly of claim 1 wherein:
    an open airflow pathway for ambient air; and
    a second set of one or more fan units, when activated, moves said ambient air through said open airflow pathway, wherein said continuous, interconnected airflow pathway forms a closed airflow pathway that is partitioned from an ambient environment.

12. The display assembly of claim 11 further comprising:
    an illumination component, which when activated, provides illumination to the optical stack, wherein said open airflow pathway extends, at least in part, rearward of said illumination component.

13. The display assembly of claim 1 further comprising:
    a cover provided forward of, and spaced apart from, said optical stack to define, at least in part, the first airflow passageway; and
    a structural framework defining, at least in part, an enclosure for the optical stack, wherein the cover forms a forward portion of the enclosure.

14. The display assembly of claim 13 wherein:
said optical stack is part of an electronic display subassembly which is connected to the structural framework within the enclosure.

15. The display assembly of claim 1 further comprising:
a differential pressure sensor fluidly connected to, and configured to measure a pressure of, ambient air and said gas in at least a portion of the continuous, interconnected airflow pathway; and
a controller in electronic communication with said differential pressure sensor and said one or more fans unit, said controller comprising software instructions, which when executed, configure the controller to adjust operations of at least one of said one or more fan units in response to measurements from said differential pressure sensor to maintain a positive difference between the measured pressure of the gas in at least the portion of the continuous, interconnected airflow pathway and the measured pressure of the ambient air.

16. The display assembly of claim 1 further comprising:
a second optical stack facing an opposing direction from said optical stack;
a fourth airflow passageway located, at least in part, forward of the second optical stack; and
a fifth airflow passageway located, at least in part, rearward of the second optical stack and forward of the first, second, and third airflow passageways, wherein said continuous, interconnected airflow pathway comprises said fourth and fifth airflow passageways, and wherein the third airflow passageway is fluidly connected to the first, second, fourth, and fifth airflow passageways.

17. A method for preventing delamination of an optical stack, said method comprising:
activating one or more fan units of a display assembly, where said display assembly comprises:
a first airflow passageway located, at least in part, forward of the optical stack;
a second airflow passageway located, at least in part, rearward of the optical stack;
a third airflow passageway located, at least in part, rearward of the second airflow passageway; and
a continuous, interconnected airflow pathway comprising each of the first, second, and third airflow passageways;
wherein said one or more fan units are positioned along the continuous, interconnected airflow pathway;
wherein activating the one or more fan units moves gas through the continuous, interconnected airflow pathway, including pushing said gas into the first and second airflow passageways, thereby generating compressive forces by the gas at the optical stack.

18. The method of claim 17 wherein:
at least one of the one or more fan units is positioned proximate to an entrance to each of the first and second airflow passageways;
the third airflow passageway extends between the entrance to each of the first and second airflow passageways and an exit of each of the first and second airflow passageways; and
said one or more fan units, when activated, pushes said gas at a relatively high-pressure into the entrance to said first and second passageways and pulls said gas at a relatively low-pressure side from the exit of said third passageway.

19. A display assembly for preventing delamination of an optical stack, said display assembly comprising:
an electronic display subassembly comprising the optical stack and a backlight, wherein said optical stack comprises a liquid crystal layer, at least one polarizer, and at least one optical enhancement film;
a cover provided forward of, and spaced apart from, a forward surface of said electronic display subassembly;
a structural framework defining, at least in part, an enclosure for the optical stack, wherein the cover forms a forward portion of the enclosure and said electronic display subassembly is connected to said structural framework within the enclosure;
a first airflow passageway located, at least in part, between a rear surface of the cover and the forward surface of the electronic display subassembly;
a second airflow passageway located, at least in part, rearward of the optical stack;
a third airflow passageway located, at least in part, rearward of the second airflow passageway;
a continuous, interconnected airflow pathway extending within the enclosure and comprising each of the first, second, and third airflow passageways, wherein at least a majority of the first, second, and third airflow passageways extend in longitudinal alignment with one another; and
one or more fan units positioned along the continuous, interconnected airflow pathway, which when activated, move gas through the continuous, interconnected airflow pathway by at least primarily pushing said gas through said first and second airflow passageways in at least primarily a same, first direction, and at least primarily pulling said gas through said third airflow passageway in at least primarily a second direction opposing the first direction, thereby generating compressive forces by the gas at the optical stack.

20. The display assembly of claim 19:
wherein:
the optical stack comprises a liquid crystal layer and one or more of: a polarizer, and anti-reflective film, an optical enhancement film, a diffusive layer, and an optically transmissive layer; and
said electronic display subassembly comprises a backlight for the optical stack; and
further comprising:
an open airflow pathway for ambient air which is located, at least in part, rearward of the backlight; and
a second set of one or more fan units, when activated, moves said ambient air through said open airflow pathway, wherein said continuous, interconnected airflow pathway forms a closed airflow pathway that is partitioned from an ambient environment.

* * * * *

UNITED STATES PATENT AND TRADEMARK OFFICE
CERTIFICATE OF CORRECTION

Page 1 of 1

PATENT NO. : 12,314,093 B2
APPLICATION NO. : 18/920434
DATED : May 27, 2025
INVENTOR(S) : William Dunn et al.

It is certified that error appears in the above-identified patent and that said Letters Patent is hereby corrected as shown below:

On the Title Page

In Item (56), References Cited, U.S. Patent Documents, please delete "7,212,403 B2 5/2007 Rockenfell" and insert -- 7,212,403 B2 5/2007 Rockenfeller --.

In Item (56), References Cited, U.S. Patent Documents, please delete "2006/0012985 A1 1/2006 Archie et al." and insert -- 2006/0012985 A1 1/2006 Archie, Jr. et al. --.

In Item (56), References Cited, Other Publications, please delete "The American Heritage College Dictionary, Third Edition, 1993, excerpt, 3 pages, Houghton Company. Civiq Smartscapes Llc. V Manufacturing Resources International, Inc., Petition for Inter Partes." and insert -- The American Heritage College Dictionary, Third Edition, 1993, excerpt, 3 pages, Houghton Mifflin Company. --.

In Item (56), References Cited, Other Publications, please delete "Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages." and insert -- CIVIQ SMARTSCAPES LLC. V MANUFACTURING RESOURCES INTERNATIONAL, INC., Petition for Inter Partes Review of U.S. Patent No. 8,854,572 including Declaration of Greg Blonder in Support of Petition, Curriculum Vitae of Greg Blonder and Prosecution History of U.S. Patent No. 8,854,572, Petition filed March 14, 2018, 427 pages. --.

Signed and Sealed this
Fifteenth Day of July, 2025

Coke Morgan Stewart
*Acting Director of the United States Patent and Trademark Office*